United States Patent
Kyouda et al.

(10) Patent No.: US 9,214,363 B2
(45) Date of Patent: Dec. 15, 2015

(54) COATING AND DEVELOPING APPARATUS, COATING FILM FORMING METHOD, AND STORAGE MEDIUM STORING PROGRAM FOR PERFORMING THE METHOD

(71) Applicant: TOKYO ELECTRON LIMITED, Minato-ku (JP)

(72) Inventors: Hideharu Kyouda, Koshi (JP); Taro Yamamoto, Koshi (JP)

(73) Assignee: TOKYO ELECTRON LIMITED, Minato-ku (JP)

( * ) Notice: Subject to any disclaimer, the term of this patent is extended or adjusted under 35 U.S.C. 154(b) by 50 days.

(21) Appl. No.: 13/937,833

(22) Filed: Jul. 9, 2013

(65) Prior Publication Data

US 2013/0293856 A1    Nov. 7, 2013

Related U.S. Application Data

(62) Division of application No. 11/672,230, filed on Feb. 7, 2007, now Pat. No. 8,518,494.

(30) Foreign Application Priority Data

Feb. 8, 2006    (JP) .................. 2006-031365

(51) Int. Cl.
  *B05C 11/02*    (2006.01)
  *H01L 21/67*    (2006.01)
  *G03F 7/11*    (2006.01)
  (Continued)

(52) U.S. Cl.
  CPC ............ *H01L 21/67017* (2013.01); *G03F 7/11* (2013.01); *G03F 7/168* (2013.01); *G03F 7/2041* (2013.01); *H01L 21/6715* (2013.01); *H01L 21/67051* (2013.01)

(58) Field of Classification Search
  CPC ....................................... B05C 11/02
  USPC ......... 118/52, 612, 319, 320, 55, 62, 63, 326; 396/604, 611, 627; 134/153, 198, 902
  See application file for complete search history.

(56) References Cited

U.S. PATENT DOCUMENTS 5,401,316 A    3/1995   Shiraishi et al.
5,608,943 A *  3/1997   Konishi et al. .................. 15/302

(Continued)

FOREIGN PATENT DOCUMENTS

EP    1 732 108 A1    12/2006
JP    2005-175079    6/2005

(Continued)

OTHER PUBLICATIONS

Office Action issued Aug. 10, 2010, in Japanese Patent Application No. 2006-031365 (with English-language translation).

*Primary Examiner* — Yewebdar Tadesse
(74) *Attorney, Agent, or Firm* — Oblon, McClelland, Maier & Neustadt, L.L.P.

(57) ABSTRACT

Disclosed is a technique for preventing a water-repellent protective film formed on a resist film from peeling off during immersion exposure. A resist film is formed on the front surface of a substrate and then the peripheral edge portion of the resist film is removed. Before forming a water-repellent protective film onto the resist film, an adhesion-improving fluid, preferably hexamethyldisilazane gas, for improving the adhesion of the water-repellent protective film, is supplied to the region from which the resist film is removed.

5 Claims, 15 Drawing Sheets

(51) Int. Cl.
*G03F 7/16* (2006.01)
*G03F 7/20* (2006.01)

(56) References Cited

U.S. PATENT DOCUMENTS

| | | | |
|---|---|---|---|
| 5,939,139 A * | 8/1999 | Fujimoto | 427/240 |
| 6,982,002 B2 * | 1/2006 | Tanaka et al. | 118/52 |
| 7,423,728 B2 | 9/2008 | Matsunaga et al. | |
| 2004/0226916 A1 * | 11/2004 | Kobayashi et al. | 216/83 |
| 2006/0067682 A1 * | 3/2006 | Kaneyama et al. | 396/604 |
| 2007/0056514 A1 * | 3/2007 | Akimoto et al. | 118/716 |

FOREIGN PATENT DOCUMENTS

| | | |
|---|---|---|
| JP | 2005-294520 | 10/2005 |
| WO | WO 2006/011427 A1 | 2/2006 |

* cited by examiner

COATING AND DEVELOPING APPARATUS, COATING FILM FORMING METHOD, AND STORAGE MEDIUM STORING PROGRAM FOR PERFORMING THE METHOD

CROSS-REFERENCE TO RELATED APPLICATIONS

The present application is a divisional application of and claims the benefit of priority under 35 U.S.C. §120 from U.S. application Ser. No. 11/672,230, filed Feb. 7, 2007, the entire contents of which is incorporated herein by reference, and which is based upon and claims the benefit of priority under 35 U.S.C. §119 from prior Japanese Patent Application No. 2006-031365, filed Feb. 8, 2006.

TECHNICAL FIELD OF THE INVENTION

The present invention relates to a technique for forming a resist film and a water-repellent protective film on a substrate to be subjected to immersion exposure.

BACKGROUND ART

In a photoresist process which is one of processes of manufacturing a semiconductor device, a resist solution is applied to the surface of a semiconductor wafer to form a resist film, and the resist film is exposed for the transfer of a predetermined pattern and thereafter is developed, thereby to form a resist pattern. A series of these processes are generally performed using a system comprising a coating and developing apparatus for the application of resist and development and an exposure apparatus connected thereto.

To meet the recent demand for miniaturization of device patterns, there has been proposed an exposure technique called immersion exposure for the purpose of enhancing the resolution of exposure. The immersion exposure is an exposure technique wherein, in a state in which a light transmitting liquid layer such as a ultra-pure water layer is formed on the surface of a wafer, light emitted from a light source is allowed to pass through the liquid layer and to irradiate the wafer surface with the light. The immersion exposure attains exposure of a high resolution by utilizing the effect that the wavelength of light in water becomes shorter than that in the air. For example, in a case where an exposure light source is ArF, the wavelength of ArF light in the air is 183 nm, while it is 134 nm in water. The immersion exposure technique is described in Japanese Patent Laid-Open Publication JP2005-294520A (the corresponding European patent laid-open publication: EP1732108A1), for example.

With reference to FIGS. 14 to 17, a description will now be given about an immersion exposure process and related problems. Before being loaded into a coating and developing apparatus, thin films of various materials (not shown for simplification of the drawings) are already formed on a silicon wafer W to be subjected to immersion exposure. In the coating and developing apparatus, an antireflection film 15, a resist film 16 and a protective film 17 are further formed on the wafer W in that order. The protective film 17 is a light-transmitting, water-repellant, thin film formed of an organic material, especially a fluorine-based material to protect the resist film 16 from the liquid used in immersion exposure.

When loaded into an exposure apparatus, the wafer W is placed on an exposure stage (not shown) and is held in a horizontal attitude. An immersion exposure head 1 is disposed above the wafer W through a slight gap between it and the wafer. A lens 10 is disposed the center of the front end of the immersion exposure head 1. Provided outside the lens 10 are a supply port 11 for supplying a liquid, e.g., pure water to the surface of the wafer W and a suction port 12 for sucking and recovering the pure water supplied to the wafer W. By supplying pure water to the surface of the wafer W from the supply port 11 and recovering the pure water from the suction port 12, a liquid layer 18 of pure water is formed between the lens 10 and the surface of the wafer W. Light emitted from a light source (not shown) passes through both lens 10 and liquid layer 18 to irradiate the wafer W with the light, whereby a predetermined circuit pattern is transferred to the resist film 16.

Subsequently, with the liquid layer 18 left present between the lens 10 and the surface of the wafer W, as shown in FIG. 15, the immersion exposure head 1 is moved to a position corresponding to the next transfer region (shot region) and the next exposure is performed. By repeating this operation, circuit patterns are transferred one after another onto the surface of the wafer W.

As known, a device is not formed in the peripheral edge area of the wafer and the outermost peripheral portion in the peripheral edge area is a beveled portion (slant portion). For the purpose of preventing the generation of particles or the like, the peripheral edge portions of the antireflection film 15 and that of the resist film 16 are removed by cleaning processes using a solvent after formation of both films, respectively. Consequently, as shown in FIG. 16, a step may be formed between the peripheral edge of the antireflection film 15 and that of the resist film 16. Also, as the foregoing various thin films (not shown) formed on the wafer W before being loaded into the coating and developing apparatus have been subjected to peripheral edge removing processes after film forming processes, respectively, the peripheral edge portions of those various thin films are also in a similar state to the antireflection film 15 and resist film 16. Accordingly, after the peripheral edge removing process for the resist film 16, the surface of the wafer W, i.e., a silicon surface 1A, is exposed in the peripheral edge area of the wafer. As a result, there exist portions where the protective film 17 is formed directly on the silicon surface 1A.

Since the protective film 17 is formed of an organic material as mentioned above, the adhesion of the protective film 17 to the silicon surface 1A is lower than that to the resist film formed of an organic material. Since the immersion exposure head 1 moves in some cases at a high speed of about 500 mm/sec during exposure, when the immersion exposure head 1 moves from the peripheral edge portion of the wafer W toward the central part together with the liquid layer 18, the protective film 17 may possibly peel off from the silicon surface 1A due to pressure from the liquid layer 18, as shown in FIG. 16(b). Moreover, in the stepped portion between the antireflection film 15 and the resist film 16, the adhesion of the protective film 17 may be low due to the complicated surface shape of the portion. Also in this case, due to movement of the immersion exposure head 1 together with the liquid layer 18, the protective film 17 may peel off near the stepped portion, as shown in FIG. 16(c). As a result, the edge portion of the resist film 16 may be exposed without being covered with the protective film 17 and peel off under the pressure of pure water which results from the movement of the immersion exposure head 1 together with the liquid layer 18. In this case, it may be impossible to carry out a normal developing process.

As shown in FIGS. 16 (b) and 16(c), if the protective film 17 and the resist film 16 peel off from the wafer W, the peeled resist film 16 and protective film 17 become particles 19. The particles 19 may adhere to the lens 10 of the exposure head 1 to obstruct a normal exposure process, or may again adhere to the wafer W to adversely affect the results of various treatments after exposure of the wafer W. The particles 19 may be scattered onto an exposure stage for placing the wafer W thereon, adhere to the succeeding wafers W, and adversely affect the treatment for those wafers. Such problems and solutions thereto are not described in JP 2005-294520A.

In some cases, in order to improve the adhesion of the resist film 16 to the surface of the wafer W, HMDS (hexamethyldisilazane) gas is supplied to the whole surface of the wafer W after formation of the antireflection film 15 and before formation of the resist film 16 to perform a hydrophobizing process (AD process) to the surface of the wafer W. This hydrophobizing process may possibly enhance the adhesion of the protective film 17 to the silicon surface 1A. However, if the formation of the resist film 16 and the removal of the resist film 16 in the peripheral edge portion of the wafer are performed after the hydrophobizing process, the effect of the hydrophobizing process on the silicon surface 1A is considerably deteriorated. Thus, it may be impossible to ensure sufficient adhesion between the silicon surface 1A and the protective film 17 even if such a hydrophobizing process is performed.

DISCLOSURE OF THE INVENTION

The present invention has been accomplished for solving the above-mentioned problems and it is an object of the invention to provide a technique for enhancing the adhesion of a protective film of a water-repellent material applied to a substrate before an immersion exposure process.

In order to achieve the objective, according to a first aspect of the present invention, there is provided a coating and developing apparatus having a resist film forming unit that applies a resist solution to a front surface of a substrate to form a resist film, and a developing unit that develops the resist film having been subjected to immersion exposure, the coating and developing apparatus including: a first peripheral edge cleaner that supplies a solvent to the resist film present in a peripheral edge portion of the substrate thereby to remove the same; a protective film forming unit that supplies a coating solution onto the resist film thereby to form a water-repellent protective film that protects the resist film from a liquid when performing the immersion exposure; and an adhesion-improving processor having an adhesion-improving fluid feeder that supplies an adhesion-improving fluid to an exposed surface before forming the protective film for improving adhesion of the protective film to the exposed surface, wherein the exposed surface is a surface exposed due to removal of the resist film from the peripheral portion. A non-limitative but most preferred example of the adhesion-improving fluid is hexamethylsilazane.

In one preferred embodiment, the adhesion-improving fluid feeder is configured to feed the adhesion-improving fluid also to a peripheral edge portion of a back surface of the substrate. In one preferred embodiment, the coating and developing apparatus further includes: an antireflection film forming unit that supplies a coating solution to the substrate before forming the resist film thereby to form an antireflection film on the front surface of the substrate; and a second peripheral edge cleaner that supplies a solvent to the antireflection film in the peripheral edge portion of the substrate before forming the resist film thereby to remove the antireflection film from the peripheral edge portion of the substrate.

In one preferred embodiment, the adhesion-improving processor further has a rotary stage configured to rotate about a vertical axis while holding the substrate horizontally; and the adhesion-improving fluid feeder has: a first adhesion-improving fluid supply nozzle adapted to locate above the peripheral edge portion of the front surface of the substrate held on the rotary stage; a second adhesion-improving fluid supply nozzle adapted to locate below a peripheral edge portion of a back surface of the substrate held on the rotary stage; and a suction nozzle adapted to suck the adhesion-improving fluid supplied to the substrate. In this case, preferably, the adhesion-improving fluid feeder has a square bracket-shaped or U-shaped nozzle body, which is arranged so as to allow the peripheral edge portion of the substrate held on the rotary stage to be inserted in the nozzle body; and the first and second adhesion-improving fluid supply nozzles and the suction nozzle are provided at the nozzle body.

In one preferred embodiment, the protective film forming unit has a rotary stage capable of rotating about a vertical axis while holding the substrate, and a nozzle that supplies a coating solution for forming a protective film to the substrate held on the rotary stage, and the adhesion-improving processor is installed within the protective film forming unit and the rotary stage in the protective film forming unit is used as the rotary stage in the adhesion-improving processor.

In one preferred embodiment, the adhesion-improving processor further has: a processing vessel; a first gas feeder, serving as the adhesion-improving fluid feeder, that supplies a gas as the adhesion-improving fluid; a stage disposed in the processing vessel for placing the substrate thereon; and an exhaust system that exhausts an interior of the processing vessel. In this case, in one preferred mode, the stage is shaped and sized such that the peripheral edge portion of the substrate projects outward from the stage when the substrate is placed on the stage; and the adhesion-improving fluid feeder is configured to supply a gas as the adhesion-improving fluid to the peripheral edge portion of the front surface of the substrate placed on the stage and to the peripheral edge portion of the back surface of the substrate. Preferably, the exhaust system is provided such that the gas as the adhesion-improving fluid supplied onto the substrate flows toward outside of the substrate.

In another preferred embodiment, the adhesion-improving fluid feeder is disposed so as to face the peripheral edge portion of the substrate placed on the stage; and the adhesion-improving processor further has a second gas feeder, disposed so as to face a center portion of the substrate placed on the stage, that supplies a purge gas toward the center portion of the substrate thereby to form a flow of the purge gas flowing toward outside of the substrate.

According to a second aspect of the present invention there is provided a method of forming at least a resist film and a water-repellent protective film on a substrate to be subjected to immersion exposure, the method including the steps of: applying a resist solution to a front surface of the substrate thereby forming a resist film; removing the resist film existing in a peripheral edge portion of the front surface of the substrate by using a solvent; supplying an exposed surface, exposed due to removal of the resist film, with an adhesion-improving fluid for improving adhesion of the protective film to the exposed surface; and thereafter applying a coating solution for forming the protective film to the front surface of the substrate thereby forming the protective film.

In one preferred embodiment, in the step of supplying the adhesion-improving fluid, the adhesion-improving fluid is supplied also to a peripheral edge portion of a back surface of the substrate. In one preferred embodiment, the method further includes the steps of: supplying, before the step of applying the resist solution, a coating solution for forming an antireflection film to the front surface of the substrate thereby forming the antireflection film; and removing the antireflection film existing in the peripheral edge portion of the front surface of the substrate by using a solvent, wherein, after the resist film removing step, a peripheral edge of the resist film is located inside a peripheral edge of the antireflection film.

In one preferred embodiment, the step of supplying the adhesion-improving fluid includes the steps of: holding the substrate horizontally on a rotary stage; accommodating the peripheral edge portion of the substrate held on the rotary stage in a space defined by a generally bracket-shaped nozzle body; rotating the substrate about a vertical axis by the rotary stage; and supplying the adhesion-improving fluid from nozzles provided in the nozzle body to the peripheral edge portions of both front and back surfaces of the substrate.

In one preferred embodiment, the step of supplying the adhesion-improving fluid includes the steps of: disposing the substrate on a stage provided within a processing vessel; supplying a gas as the adhesion-improving fluid to the peripheral edge portion of the front surface of the substrate disposed on the stage; and exhausting an interior of the processing vessel. in this case, in one preferred mode, the stage is shaped and sized such that the peripheral edge portion of the substrate projects outward from the stage when the substrate is disposed on the stage, and wherein, in the step of supplying the adhesion-improving fluid, a gas as the adhesion-improving fluid is supplied also to a peripheral edge portion of a back surface of the substrate. Preferably, the step of exhausting the interior of the processing vessel exhausts the gas supplied onto the substrate so that the supplied gas flows toward outside of the substrate. In another preferred embodiment, the step of supplying the adhesion-improving fluid is performed with a purge gas being supplied to a center portion of the front surface of the substrate disposed on the stage and with a flow of the purge gas flowing toward the outside of the substrate being formed.

According to a third aspect of the present invention, there is provided a computer-readable storage medium storing a program, the program being configured such that, when the program is executed by a control computer connected to the foregoing coating and developing apparatus, the control computer controls the coating and developing apparatus so as to execute the foregoing method.

DESCRIPTION OF PREFERRED EMBODIMENTS

Figure 1:
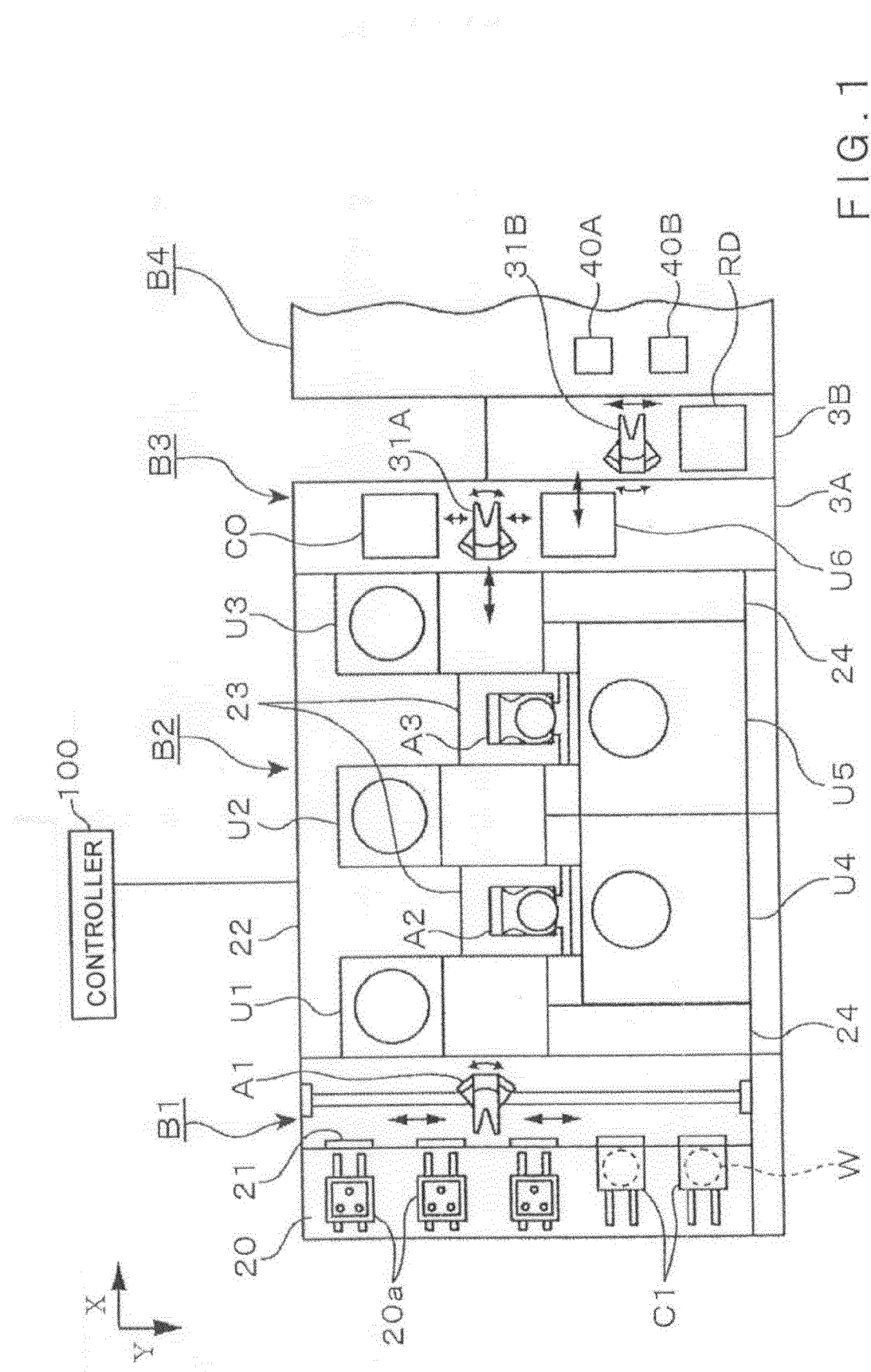
FIG. 1 is a schematic plan view showing a coating and developing apparatus in one embodiment of the present invention together with an immersion exposure apparatus connected thereto.
Figure 2:
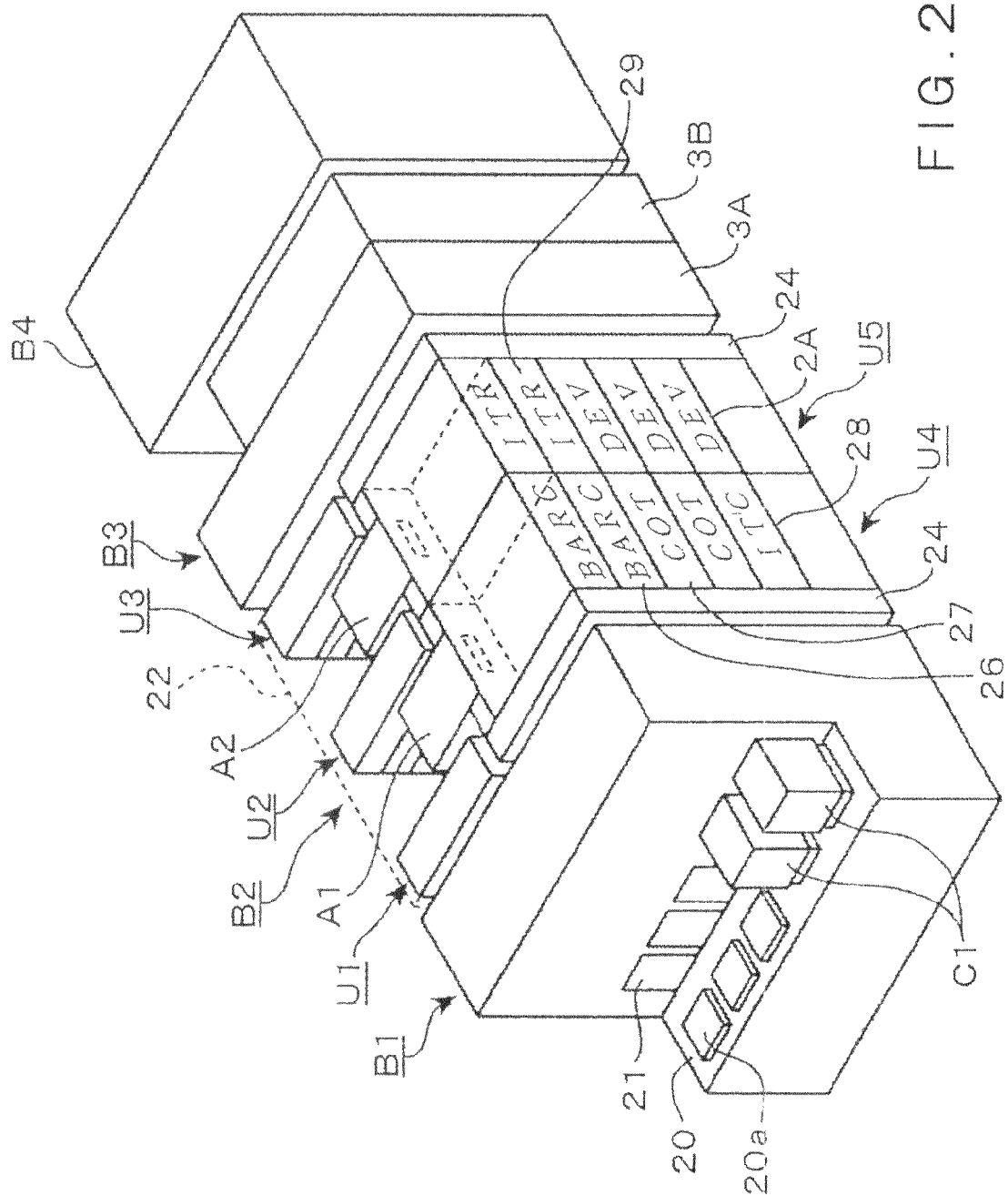
FIG. 2 is a schematic perspective view of the coating and developing apparatus shown in FIG. 1.

With reference to FIGS. 1 and 2, a description will be given briefly about an entire configuration of a coating, exposing and developing system composed of a coating and developing apparatus in one embodiment of the present invention and an immersion exposure apparatus connected thereto. In the following description, for simplification of explanation, X-axis positive direction, X-axis negative direction, Y-axis positive direction, and Y-axis negative direction, in FIG. 1, will be designated "front," "rear," "right," and "left," respectively. A carrier block B1 is provided with: a carrier station 20 having mount portions 20a, to and from which carriers C1 each containing, for example, thirteen substrates such as wafers, in a sealed state are transferred; apertures formed in a wall in front of the carrier station 20 and respectively provided with shutters 21; and a wafer conveyer A1 for taking out wafers W from the carriers C1 through the apertures. The wafers W, which are loaded to the carrier station 20 while being contained in each carrier C1, are formed of silicon. As described in the foregoing "BACKGROUND ART", the peripheral edge area of the front surface of each wafer W is not covered with a thin film, and thus silicon is exposed.

A process block B2 surrounded with a housing 22 is connected to a front side of the carrier block B1. Provided in the process block B2 are unit stacks U1, U2 and U3 each including a heating/cooling unit, liquid-processing unit stacks U4 and U5, and main conveyers A2 and A3 for transferring wafers W between units. The main conveyers A2 and A3 are disposed respectively within spaces surrounded by partition walls 23, which includes walls of the unit stacks (U1, U2; U2, U3) positioned on the front and rear sides of the main conveyers, walls of the liquid-processing unit stacks (U4; U5) positioned on the right side thereof and walls positioned on the left side thereof. Reference numeral 24 denotes temperature/humidity adjusting units each provided with a temperature adjusting device for adjusting temperatures of processing solutions used in respective units and a duct of temperature/humidity adjustment.

As shown in FIG. 2, the liquid-processing unit stack U4 is constituted by stacking, on a chemical-containing part containing chemicals such as a resist solution and an antireflection film forming solution: one protective film forming unit (ITC) 28 that applies a coating solution to form a protective film; two resist coating units (COT) 27 that apply a resist solution to form a resist film; and two antireflection film forming units (BARC) 26 that apply a coating solution to form an antireflection film, in that order from below. The protective film forming unit (ITC) 28 applies a coating solution containing a water-repellent organic material to the entire front surface of a wafer W having thereon a resist film to form a water-repellent protective film for preventing a liquid from penetrating into the resist film during immersion exposure. The configuration of the protective film forming unit 28 and that of the resist film coating unit 27 will be described in detail later.

The liquid-processing unit stack U5 is constituted by stacking, on a chemical-containing part containing chemicals such as a developing solution, three developing units (DEV) 2A and two water-repellant protective film removing units (ITR) 29 for removing the water-repellent protective film in that order from below.

Each of the unit stacks U1, U2 and U3 are constituted by stacking, at multiple (e.g., 10) levels, various units that perform pre-treatments and post-treatments for the liquid treatments performed by the liquid-processing unit stacks U4 and U5. The unit stacks U1, U2 and U3 include a hydrophobizing unit that hydrophobize the entire front surface of a wafer W before formation of a resist film, a heating unit (PAB) that heats (bakes) the wafer W, and a cooling unit that cools the wafer W. A transfer unit (TRS) for transferring a wafer W between the carrier block B1 and the process block B2 is installed in the unit stack U1, and a transfer unit (TRS) for transferring a wafer W between the process block B2 and an interface block B3 is installed in the unit stack U3.

In front of the unit stack U3, an exposure apparatus B4 is connected to the process block B2 through the interface block B3. The interface block B3 is made up of a first transfer chamber 3A and a second transfer chamber 3B which are arranged anteroposteriorly between the process block B2 and the exposure apparatus B4. A first transfer arm 31A and a second transfer arm 31B, which are substrate conveyers, are provided in the transfer chambers 3A and 3B, respectively. A unit stack U6 and a buffer cassette C0 are provided in the first transfer chamber 3A. The unit stack U6 is constituted by vertically stacking: a transfer stage (TRS) that mediates transferring of a wafer W between the first and second transfer arms 31A, 31B; and plural units including a heating unit (PEB) that heats a wafer W having been subjected to an exposure process and a high precision temperature adjusting unit having a cooling plate.

Provided in the second transfer chamber 3B is a cleaning unit (RD) for cleaning the front surface of a wafer W to remove water droplets adhering to the water W in immersion exposure. The exposure apparatus B4 is provided with a stage 40A that receives a wafer W from the interface block B3 and a stage 40B that delivers an exposed wafer W to the interface block B3.

The coating and developing apparatus is provided with a controller 100 comprising a computer. Stored in the computer is a control program, which is configured so that operations of the coating and developing apparatus (described later), such as adjustment of the temperature of a wafer W in the heating and cooling units, various film forming processes for a wafer W, hydrophobizing process for a wafer W, and transferring of a wafer W between the units, are carried out according to a predetermined process recipe. Upon execution of the control program stored in a program storage part, the computer, i.e., the controller 100 sends instructions to various functional elements, including various units and conveyers, to control the operation of the coating and developing apparatus. The control program can be stored in a hard disk drive which is a storage medium provided fixedly in the computer. Alternatively, the control program may be stored in a removable storage medium such as a compact disc, a magnet optical disc or a memory card, and may be executed by being read with a reader provided in the computer.

Next, with reference to FIGS. 3 and 4, the configuration of a resist coating unit (COT) 27 will be described in detail. The coating unit 27 is provided with a housing 50, i.e., a processing vessel. A transfer port 51 for the wafer W is formed in a side wall, facing the main conveyer A2, of the housing 50. The transfer port 51 can be opened and closed with a shutter 52 installed in the same port. Disposed in the interior of the housing 50A is a stage 53 is for placing a wafer W thereon. The stage 53 is constituted as a vacuum chuck that sucks the central part of the back surface of a wafer W to hold it horizontally. The stage 53 is connected to a driver 53b through a shaft 53a. The driver 53b can raise and lower the stage 53 and can rotate the stage 53 about a vertical axis, thereby spin coating of a resist solution (described later) and transferring of a wafer W to and from the main conveyer A2 are possible.

A cup 54 having an open upper end is disposed so as to surround the peripheral edge of the wafer W held on the stage 53. An upper end portion of the circumferential wall of the cup 54 is inclined inwards. Provided at the bottom of the cup 54 is a fluid recovery part 55 extending circumferentially throughout the whole circumference of the cup. The fluid recovery part 55 is partitioned into an outer region and an inner region. A drain port 56 for draining the recovered resist solution is formed in the bottom of the outer region. Two exhaust ports 57 and 58 are formed in the bottom of the inner region. Gas in the cup 54 is discharged at a predetermined flow rate through the exhaust ports 57 and 58, whereby the resist solution scattered due to rotation of the wafer W is drawn into the fluid recovery part 55 and is discharged from the drain port 56.

Reference numeral 61 denotes a resist solution supply nozzle for supplying the resist solution to the wafer W. One end of a resist solution supply pipe 62 is connected to the resist solution supply nozzle 61, while the other end of the resist solution supply pipe 62 is connected through a valve V1 to a resist solution supply source 63 which stores the resist solution. One end of an arm 64 which supports the resist solution supply nozzle 61 is connected to the resist solution supply nozzle 61, while the other end of the arm 64 is connected to a driver 65. The driver 65 is slidable along a guide rail 66 which is laid horizontally in the longitudinal direction of the housing 50.

An area, outside the cup 54, on the side opposite to the transfer port 51 in the housing 50 is a stand-by area of the resist solution supply nozzle 61. During transfer of a wafer W between the main conveyer A2 and the stage 53, the supply nozzle 61 stands by in the stand-by area. When a wafer W is held on the stage 53, the resist solution supply nozzle 61 moves to a position above the central part of the wafer W according to the movement of the driver 65. Thereafter, the valve V1 is opened, so that the resist solution flows at a predetermined flow rate into the supply pipe 62 from the resist solution supply source 63 and is supplied from the supply nozzle 61 to the central part of the wafer W.

Reference numeral 71 denotes an edge rinse nozzle (a first peripheral edge cleaner) that supplies a solvent to the peripheral edge portion of a wafer W on which a resist film has been formed. One end of a solvent supply pipe 72 is connected to the edge rinse nozzle 71, while the other end of the supply pipe 72 is connected through a valve V2 to a solvent supply source 73 which stores a solvent for a resist, e.g., thinner. One end of an arm 74 for supporting the nozzle 71 is connected to the edge rinse nozzle 71, while the other end of the arm 74 is connected to a driver 75. The driver 75 is adapted for rotation about a vertical axis. The edge rinse nozzle 71 moves from a stand-by area outside the cup 54 to a processing position above the peripheral edge of the wafer W, according to the rotation of the driver 75.

When the edge rinse nozzle 71 moves to a position above the peripheral edge portion of the wafer W, the valve V2 is opened, so that the solvent flows at a predetermined flow rate into the supply pipe 72 from the solvent supply pipe 73, and is supplied from the edge rinse nozzle 71 to the peripheral edge portion of the wafer W being rotated by the stage 53. As a result, the resist film in the peripheral edge portion of the wafer W is removed such that the peripheral edge of the resist film is positioned inside the peripheral edge of the antireflection film underlying the resist film. Note that, after formation of the antireflection film and before being conveyed to the resist coating unit (COT) 27, the wafer W is conveyed to a heating unit in the unit stacks U1 to U3 and is subjected to heat treatment, whereby the antireflection film is baked to be hardened. Thus, the antireflection film is solved little by the solvent supplied from the edge rinse nozzle 71.

Figure 4:
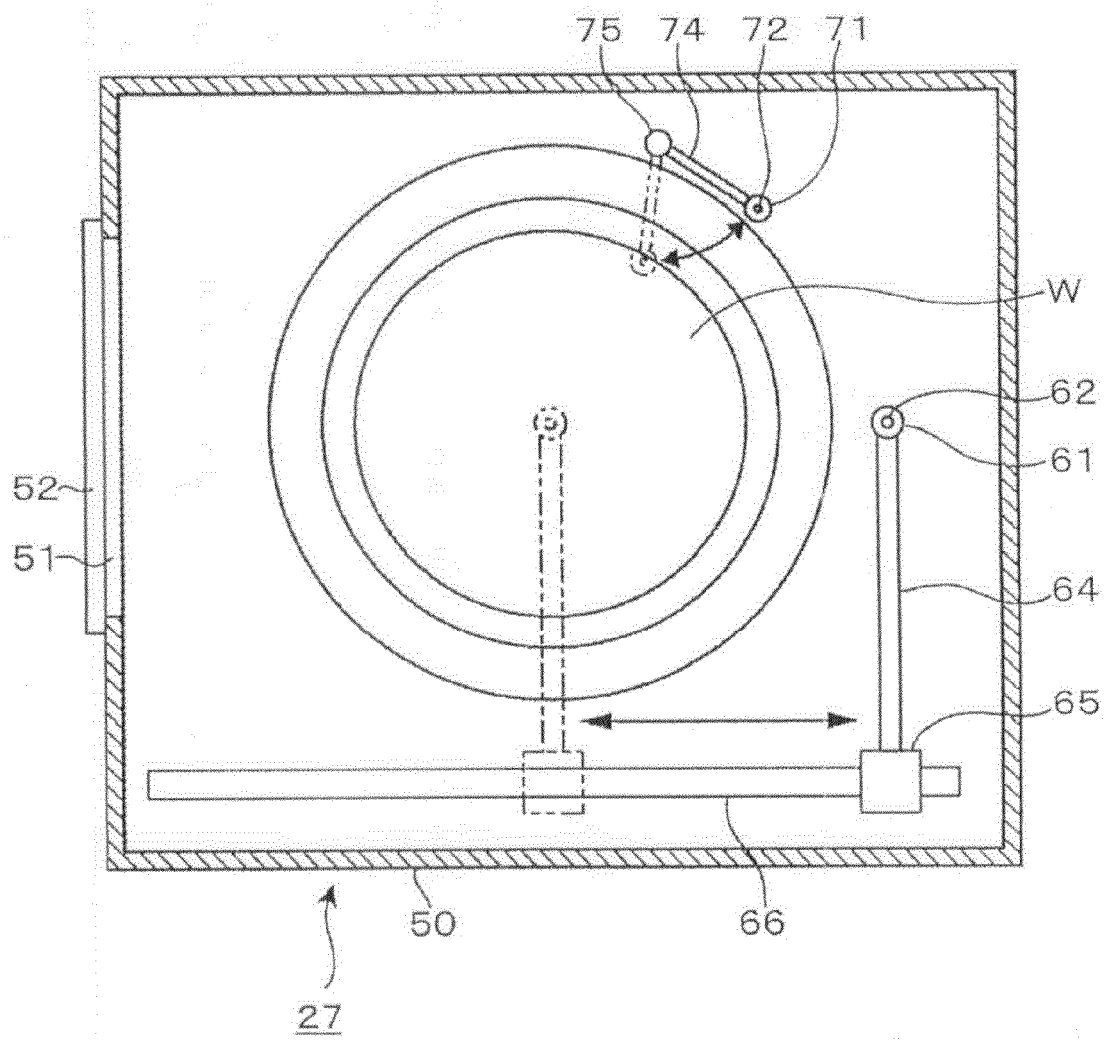
FIG. 4 is a schematic plan view of the resist coating unit shown in FIG. 3.

In FIG. 4, the resist solution supply nozzle 61 and the edge rinse nozzle 71 positioned in respective stand-by areas are indicated by solid lines, while the resist solution supply nozzle 61 and the edge rinse nozzle 71 positioned in respective processing positions (positions for processing a wafer W) are indicated by two-dot chain lines.

Figure 3:
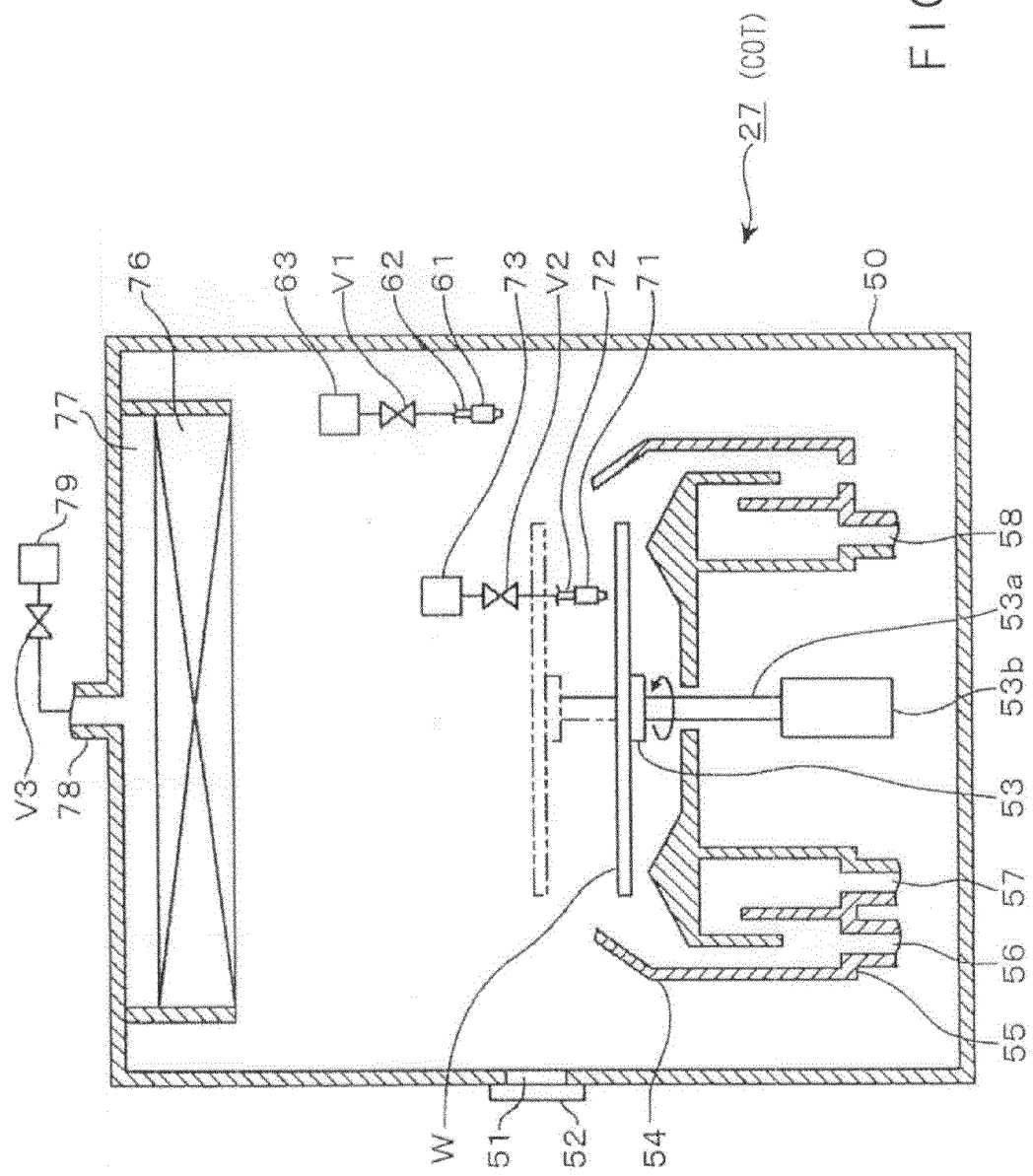
FIG. 3 is a schematic side view in vertical cross section of a resist coating unit provided in the coating and developing apparatus shown in FIG. 1.

As shown in FIG. 3, a filter 76 for removing particles is disposed in an upper portion in the housing 50. A vent chamber 77, which is a partitioned space, is formed in an upper portion of the filter 76. One end of a gas supply pipe 78 opens into the vent chamber 77, while the other end of the gas supply pipe 78 is connected to an $N_2$ gas supply source 79 storing $N_2$ gas, for example. While the wafer W is loaded into the housing 50 and a resist film forming process is carried out, a valve V3 is opened so that $N_2$ gas supplied from the gas supply source 79 to the vent chamber 77 flows downwardly into the housing 50.

The antireflection film forming units 26, the protective film removing units 29 and the developing units 2A included in the unit stacks U4 and U5 have the same configuration as that of the resist coating unit 27 except that they are different in point of chemicals supplied to the wafer W. For example, in each antireflection film forming unit 26, there are provided: a coating solution supply nozzle, for supplying a coating solution to form an antireflection film, having the same configuration as the resist solution supply nozzle 61; and an edge rinse nozzle (a second peripheral edge cleaner) having the same configuration as the edge rinse nozzle 71. The edge rinse nozzle in the antireflection film forming unit 26 supplies a solvent to the peripheral edge portion of the wafer W to remove the antireflection film present in the peripheral edge portion.

Figure 5:
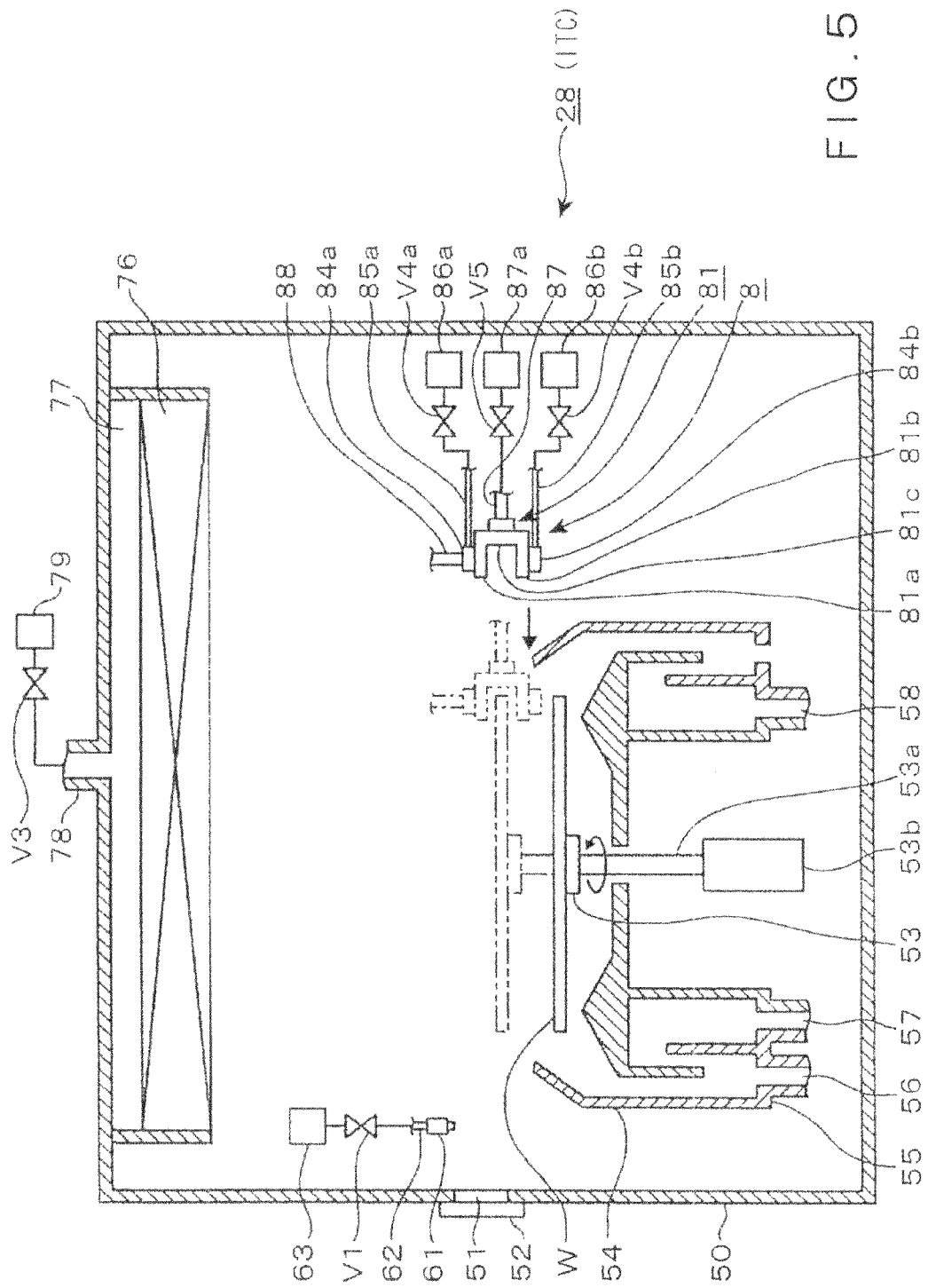
FIG. 5 is a schematic side view in vertical cross section of a protective film forming unit provided in the coating and developing apparatus shown in FIG. 1.
Figure 6:
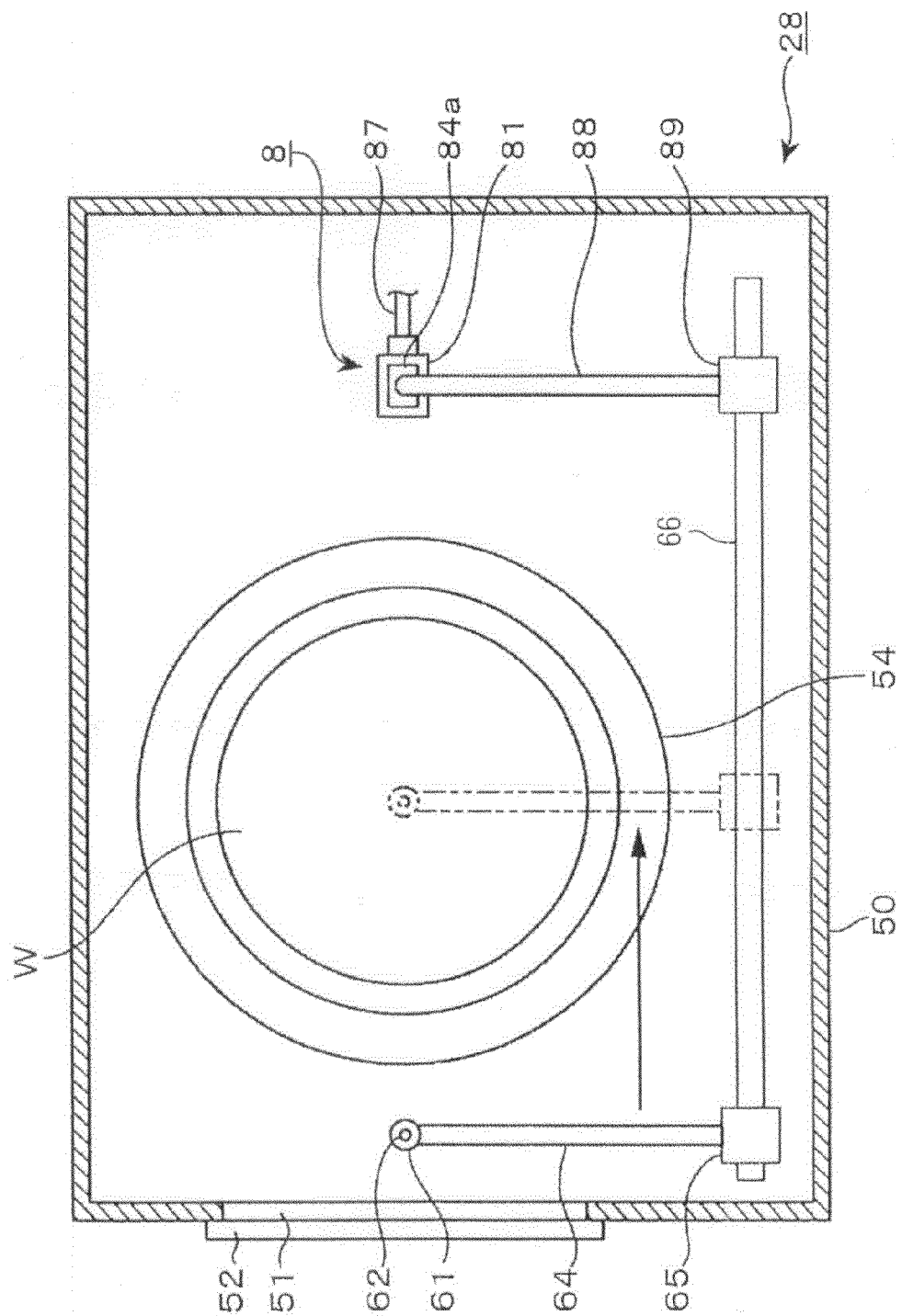
FIG. 6 is a schematic plan view of the protective film forming unit shown in FIG. 5.

Next, the configuration of the protective film forming unit 28 will be described with reference to FIGS. 5 and 6. The protective film forming unit 28 has almost the same configuration as the resist coating unit 27. Therefore, different points from the coating unit 27 will mainly be described. In FIGS. 5 and 6, component members of the protective film forming unit 28 corresponding to the component members of the resist coating unit 27 shown in FIGS. 3 and 4 are designated by the same reference numerals as those of the resist coating unit 27. The supply nozzle 61 in the protective film forming unit 28 supplies a coating solution for forming the protective film to the wafer W. In the protective film forming unit 28, an area, outside the cup 54, on the transfer port 51 side in the housing 50 serves as a stand-by area of the supply nozzle 61.

Disposed in the protective film forming unit 28 is an adhesion-improving processor 8 for improving the adhesion between a wafer W and the protective film. The adhesion-improving processor 8 will now be described with reference to FIG. 7. The adhesion-improving processor has an adhesion-improving fluid feeder. The adhesion-improving fluid feeder has a nozzle body 81 of a bracket shape (a shape of a rectangle having one opened side or a laterally-facing U shape) in side view. The nozzle body 81 has an upper side portion 81a, a lower side portion 81b and a lateral side portion 81c.

A large number of gas supply ports 82a and 82b serving as a gas supply portion are formed at intervals in the lower surface of the upper side portion 81a and the upper surface of the lower side portion 81b, respectively. The gas supply ports 82a and 82b supply HMDS (hexamethylenedisilazane) gas to the peripheral edge portions of both of the front surface and the back surface of the wafer W when the nozzle body 81 moves to the wafer processing position, which will be described later. Consequently, in the peripheral edge portion of the wafer front surface, an exposed surface exposed due to removal of the resist film and the antireflection film is rendered hydrophobic by the HMDS gas to improve the adhesion of the subsequently-formed protective film to the exposed surface. That is, the upper side portion 81a provided therein with the gas supply port 82a acts as a first fluid supply nozzle of the adhesion-improving processor, while the lower side portion 81b provided therein with the gas supply port 82b acts as a second fluid supply nozzle of the adhesion-improving processor.

The gas supply ports 82a and 82b are in communication with gas flow paths 83a and 83b, respectively, which are formed in the upper side portion 81a and the lower side portion 81b. The gas flow paths 83a and 83b extend up to gas inlet ports 84a and 84b which are formed above the upper side portion 81a and below the lower side portion 81b, respectively. One ends of supply pipes 85a and 85b are connected to the gas inlet ports 84a and 84b, respectively. The other ends of the gas supply pipes 85a and 85b are respectively connected through valves V4a and V4b to HMDS gas supply sources 86a and 86b in which HMDS gas is stored.

Figure 7:
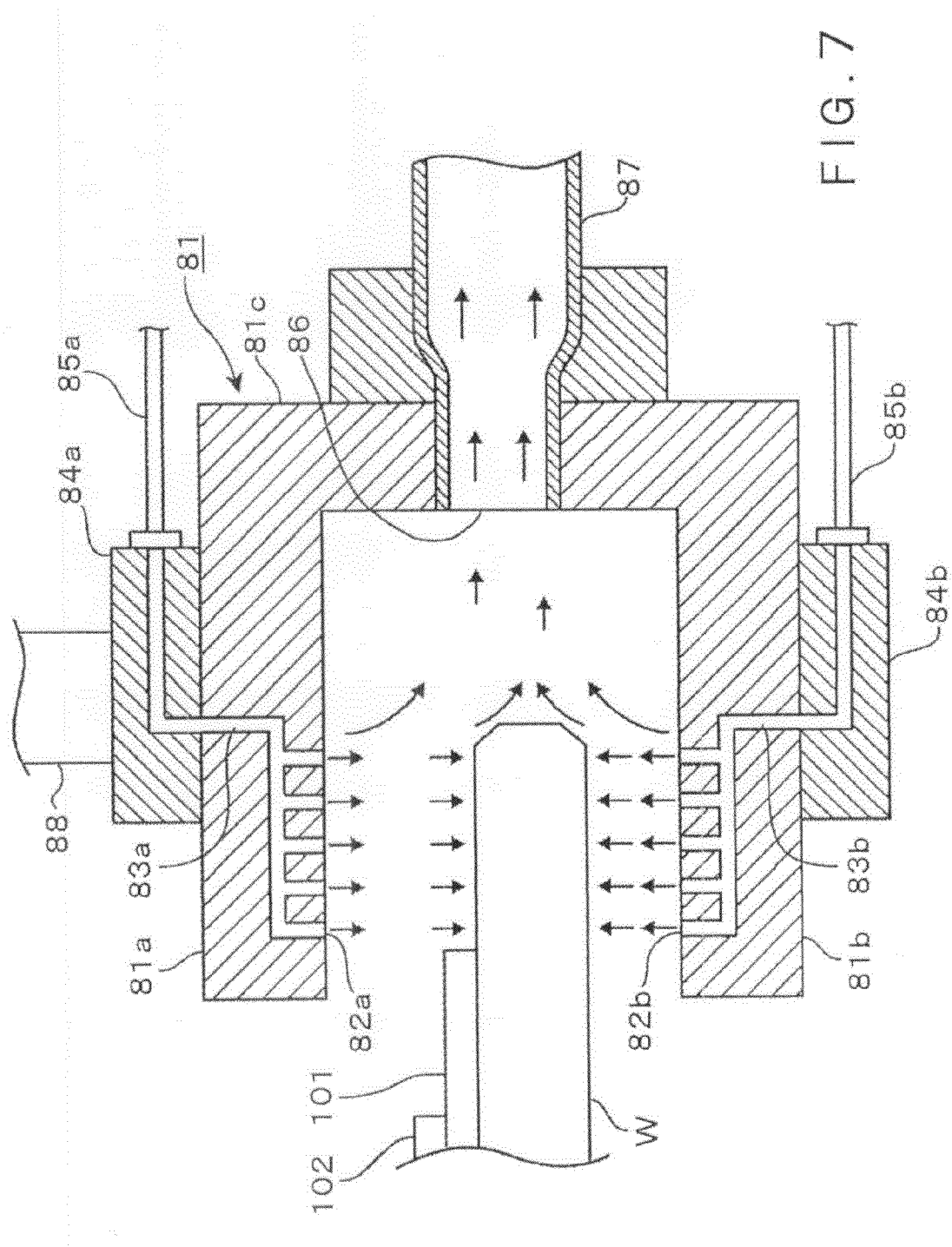
FIG. 7 is a schematic vertical sectional view of an adhesion-improving processor incorporated into the protective film forming unit shown in FIG. 5.

In the lateral side portion 81c of the nozzle body 81, a suction port 86, or a suction nozzle, is formed at the center portion of the surface facing the wafer W. One end of a suction pipe 87 is connected to the suction port 86. The other end of the suction pipe 87 is connected to a suction mechanism 87a, e.g., a vacuum pump, through a valve V5. As noted previously, the suction port 86 suctions the space surrounded by the upper, lower and lateral side portions 81a, 81b, 81c of the nozzle body 1 when HMDS gas is discharged from the gas supply ports 82a and 82b. As a result, surplus HMDS gas supplied from the gas supply ports 82a and 82b and $NH_3$ (ammonia) gas generated through reaction of HMDS gas with water present on the surface of the wafer W, are sucked and removed from the suction port 86. Arrows shown in FIG. 7 represent gas flows in the space surrounded by the side portions 81a to 81c during process of the wafer W.

One end of an arm 88 which supports the nozzle body 81 is connected to a part, above the gas inlet port 84a, of the upper side portion 81a. The other end of the arm 88 is connected to a driver 89 which is slidable on the guide rail 66. An area, outside the cup 54, on the side opposite to transfer port 51 in the housing 50 of the protective film forming unit 28 serves as a stand-by region of the nozzle body 81. In FIG. 5, the nozzle body 81 positioned in the stand-by area is indicated by solid lines. During transfer of the wafer W between the stage 53b raised by the driver 53b and the main conveyer A2, the nozzle body 81 stands by in the aforesaid stand-by area. After the stage 53 receives the wafer W, the nozzle body 81 moves to the processing position indicated by two-dot chain lines in FIG. 5 according to movement of the driver 89. At this time, the peripheral edge portion of the wafer W is positioned between the upper side portion 81a and the lower side portion 81b.

Figure 8:
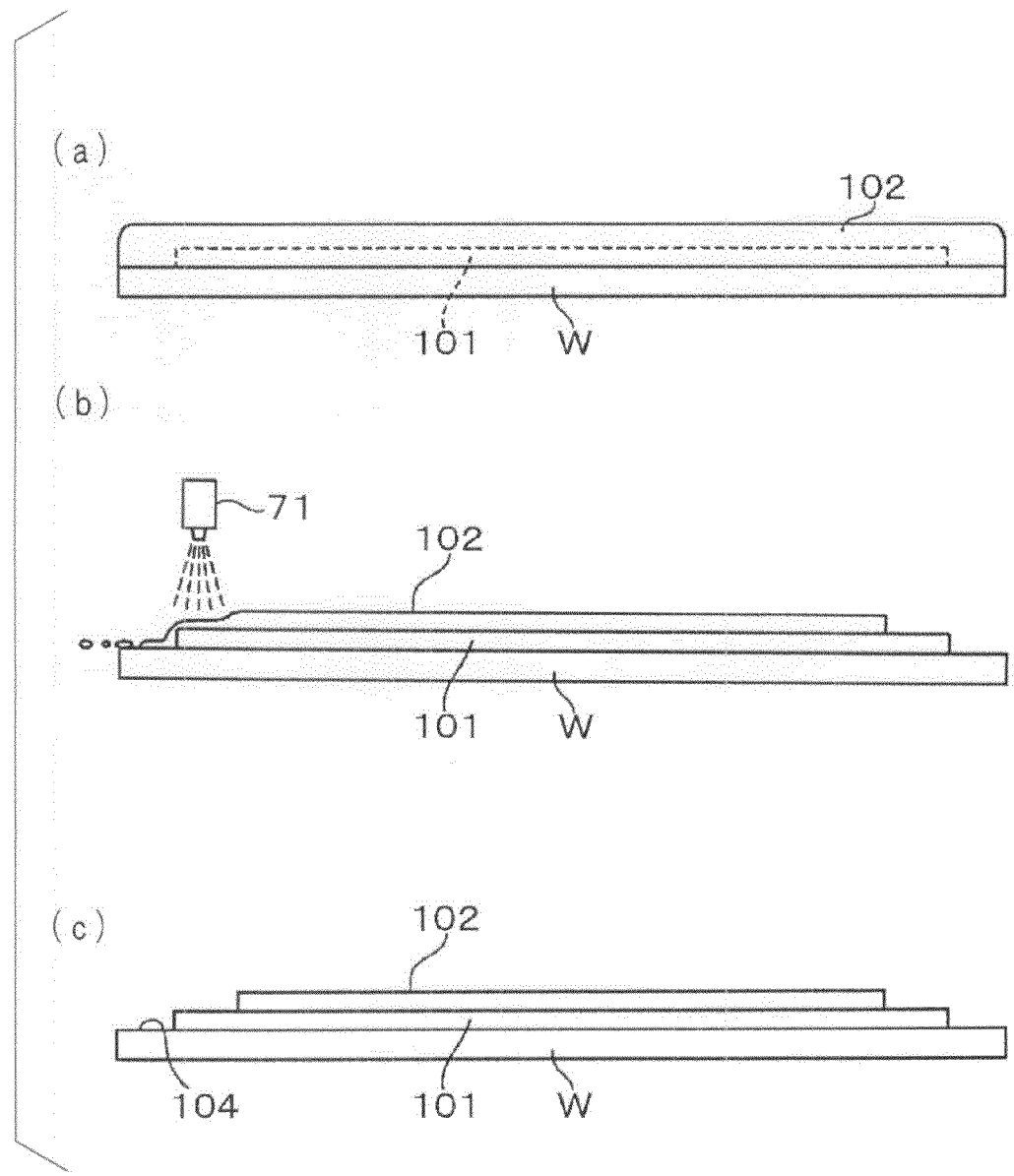
FIG. 8 is an explanatory diagram illustrating formation of a resist film on an antireflection film.
Figure 9:
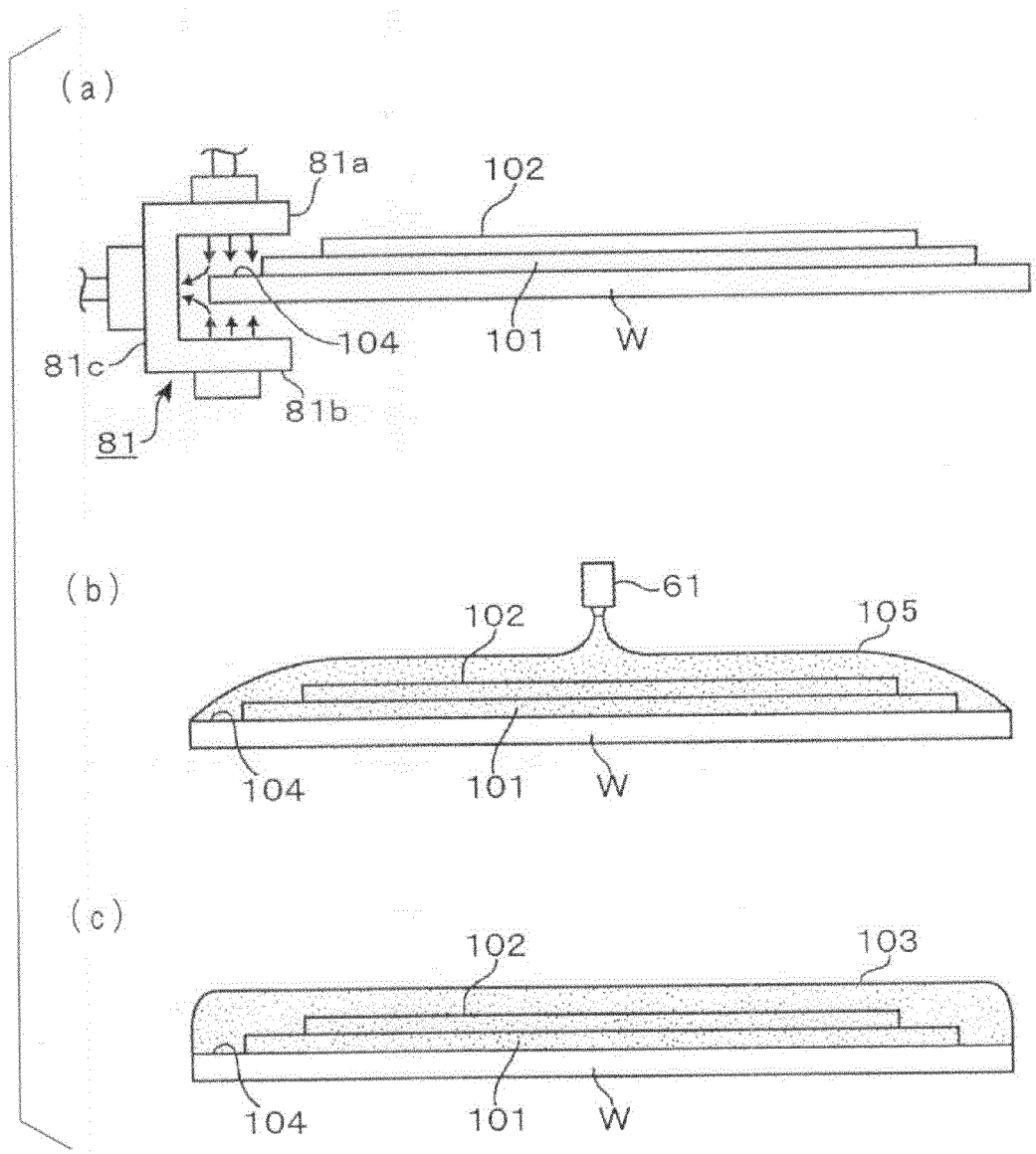
FIG. 9 is an explanatory diagram showing an adhesion-improving step and a protective film forming step.
Figure 10:
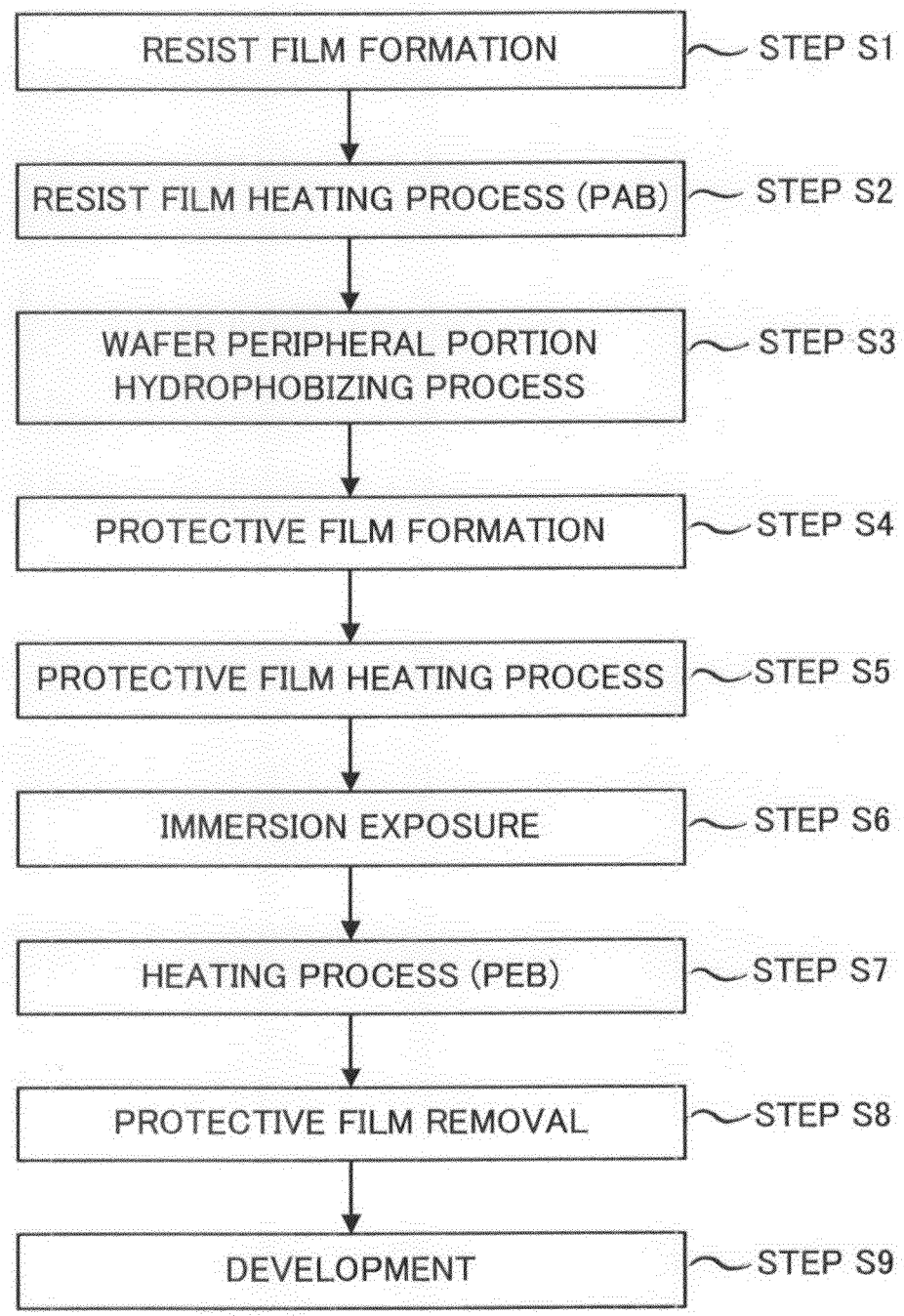
FIG. 10 is a flow chart showing a series of steps carried out by the coating and developing apparatus shown in FIG. 1.

Next, the operation of the processing system including the foregoing coating and developing apparatus will be described with reference also to FIGS. 8 to 10. First, when a carrier C1 containing wafers W which has been conveyed from the exterior of the processing system is put on a carrier portion 20a, the shutter 21 opens, a lid of the carrier C1 is removed, and a wafer W is taken out by the wafer conveyer A1. The wafer W thus taken out is conveyed to the main conveyer A2 through the transfer unit (TRS) included in the unit stack U1.

The main conveyer A2 transfers the wafer W to the antireflection film forming unit 26, in which a coating solution for forming an antireflection film is supplied to the entire front surface of the wafer from the supply nozzle to form an antireflection film 101. Thereafter, a solvent is supplied from the edge rinse nozzle to the peripheral edge portion of the wafer W, whereby the antireflection film 101 present in the peripheral edge portion is removed. Then, the wafer W is transferred to the main conveyer A2, the heating unit included in either the unit stack U1 or U2, the main conveyer A2, the cooling unit included in either the unit stack U1 or U2, the hydrophobizing unit included in either the unit stack U1 or U2, the cooling unit included in either the unit stack U1 or U2 and the main conveyer A2, in that order. Subsequently, the wafer W is transferred to a resist coating unit (COT) 27 by the main conveyer A2 and the central part of the back surface of the wafer W is chucked to be held by the raised stage 53. Upon withdrawal of the main conveyer A2 from the resist coating unit 27, the stage 53 descends while holding the wafer W. After the wafer W is accommodated in the cup 54, the resist solution supply nozzle 61 moves from the stand-by area outside the cup 54 to the processing position above the central part of the wafer W.

Subsequently, the wafer W is rotated by the driver 53b at a predetermined speed about a vertical axis via the stage 53, and the valve V1 is opened to supply the resist solution from the resist solution supply nozzle 61 to the wafer W. By virtue of centrifugal force, the resist solution thus supplied spreads from the central part of the wafer W to the peripheral edge portion of the same. That is, the resist solution is applied to the wafer W by a spin coating method. The resist solution is supplied for a predetermined time, and thereafter the supply of the resist solution is stopped. After that, the rotation of the wafer W is continued for a while, during which the solvent contained in the resist solution volatilizes and a resist film 102 is formed on the wafer W so as to entirely cover the antireflection film 101, as shown in FIG. 8(a).

Next, the edge rinse nozzle 71 moves by the driver 75 to a position above the peripheral edge portion of the wafer W from its stand-by area, and a solvent is supplied from the rinse nozzle 71 to the peripheral edge portion of the rotating wafer W, as shown in FIG. 8(b), whereby the resist film 102 in the peripheral edge portion is removed. As a result, as shown in FIG. 8(c), the peripheral edge portion of the wafer W is exposed, and the peripheral edge of the resist film 102 is positioned inside the peripheral edge of the antireflection film 101 (step S1).

Upon completion of the removal of the resist film 102 in the peripheral edge portion, the supply of the solvent is stopped and the rotation of the wafer W is stopped, and the resist solution supply nozzle 61 and the rinsing nozzle 71 are withdrawn to the respective stand-by areas. Thereafter, the driver 53b raises, via the stage 53, the wafer W to a position outside of the cup 54 as indicated by chain dotted lines in FIG. 3. The main conveyer A2 enters the interior of the unit 27, receives the raised wafer W, and transfers the wafer W to the heating unit (PAB) included in either the unit stack U1 or U2. In this heating unit, the wafer W is subjected to a heating process at a predetermined temperature, whereby the solvent contained in the resist film 102 is vaporized to be removed (step S2).

After the heating process, the wafer W is taken out from the heating unit (PAB) and is loaded into the cooling unit included in either the unit stack U1 or U2 by the main conveyer A2. Next, the main conveyer A2 transfers the wafer W, which has been subjected to temperature adjustment in the cooling unit, into the protective film forming unit 28. Then, the stage 53 in the protective film forming unit 28 rises and chucks the central part of the back surface of the wafer W. Upon withdrawal of the main conveyer A2 from the protective film forming unit 28, the nozzle body 81 of the adhesion-improving processor 8 moves from its stand-by area toward the wafer W and stops in its processing position in which the peripheral edge portion of the wafer W is positioned between the upper side portion 81a and the lower side portion 81b of the nozzle body 81.

Subsequently, the drive section 53b rotates, via the stage 53, the wafer W at a predetermined speed. The valves V4a, V4b and V5 are opened slightly after the start of rotation of the wafer W. Thereby, HMDS gas is supplied from the supply ports 82a and 82b of the nozzle body 81 toward both the front surface and the back surface of the peripheral edge portion of the wafer W, and the space surrounded by the upper side portion 81a, lower side portion 81b and lateral side portion 81c of the nozzle body 81 is suctioned through the suction port 86, whereby gas flow as indicated by arrows in FIG. 9(a) is formed in the space. By being exposed to the gas flow, the area, which extends from an exposed surface 104 of the peripheral edge portion of the front surface of the wafer W through the peripheral edge side face of the wafer W to the peripheral edge portion of the back surface of the wafer W, is rendered hydrophobic, so that the adhesion of the area to the protective film 103 is improved. At this time, surplus HMDS gas and $NH_3$ gas, the latter being a reaction product between the HMDS gas and the moisture present on the wafer front surface, are suctioned through the suction port 86 to be removed from space surrounded by the bracket-shaped nozzle body 81 (step S3).

When a predetermined time has elapsed after opening of the valves V4a, V4b and V5 so that the hydrophobizing process for the peripheral edge portion of the wafer W is completed, these valves are closed and the supply of HMDS gas from the supply ports 82a and 82b is stopped and the suctioning through the suction port 86 is stopped. Thereafter, the rotation of the stage 53 is stopped and the nozzle body 81 is withdrawn to its stand-by area. Then, the stage 53 descends so that the wafer W is accommodated in the cup 54. Subsequently, the liquid supply nozzle 61 for supplying a protective film forming material moves from the stand-by area outside the cup 54 to the processing position above the central part of the wafer W.

After the liquid supply nozzle 61 moves to the processing position, the driver 53b rotates, through the stage 53, at a predetermined speed about a vertical axis. Almost simultaneously with the start of rotation of the wafer W, the valve V1 is opened, so that a protective film forming material 105 is supplied from the liquid supply nozzle 61 to the wafer W, and spreads from the central part of the wafer W to the peripheral edge portion due to centrifugal force, similar to the resist solution described above, as shown in FIG. 9(b). After a predetermined time has elapsed from the supply of the protective film forming material 105, the supply of the material 105 is stopped. The rotation of the wafer W is continued for a while, so that the solvent contained in the protective film forming material 105 volatilizes whereby a water-repellent protective film 103 is formed on the entire surface of the wafer W, as shown in FIG. 9(c) (step S4).

After the formation of the protective film 103, the rotation of the wafer W is stopped and the supply nozzle 61 is withdrawn to its stand-by area. Thereafter, the stage 53 rises while holding the wafer W and delivers the wafer to the main conveyer A2 which has entered into the unit 28. The main conveyer A2 transfers the wafer W into the heating unit included in either the unit stack U1 or U2, in which the wafer is subjected to a heating process at a predetermined temperature (step S5).

Figure 14:
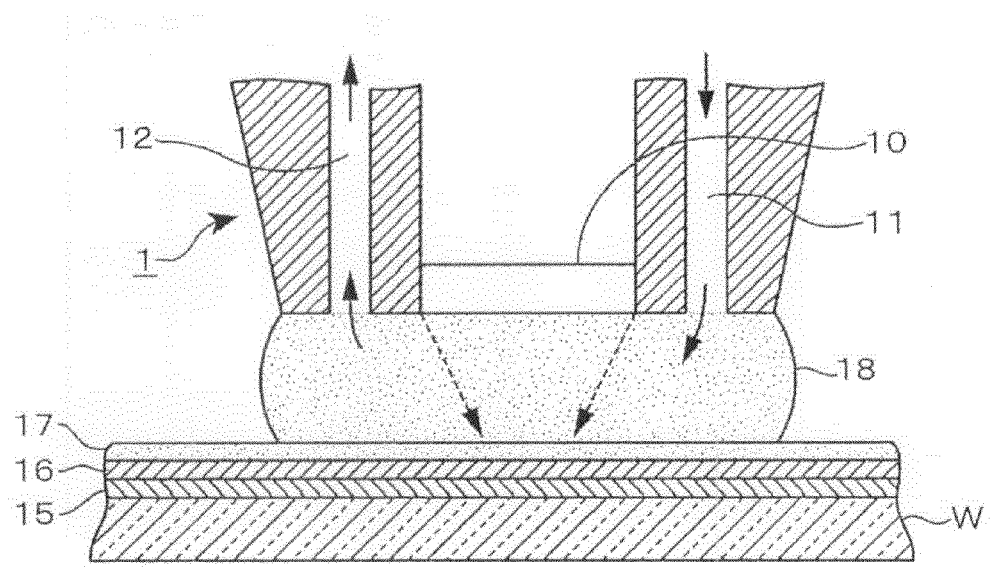
FIG. 14 is a schematic sectional view illustrating an immersion exposure process.
Figure 15:
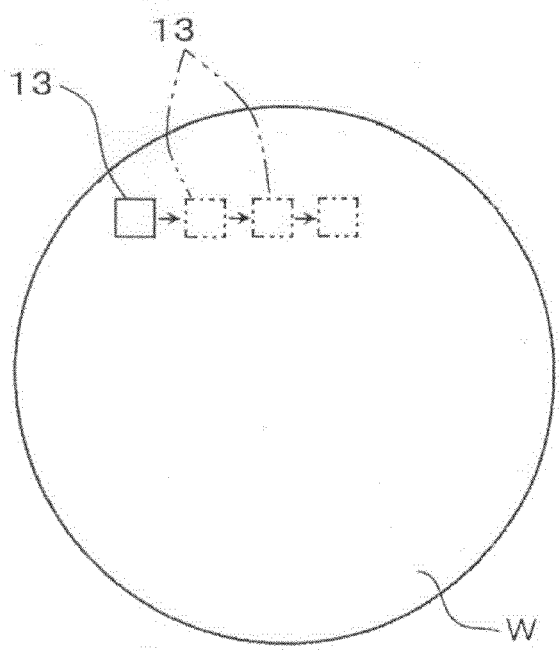
FIG. 15 is a schematic plan view illustrating the immersion exposure process.
Figure 16:
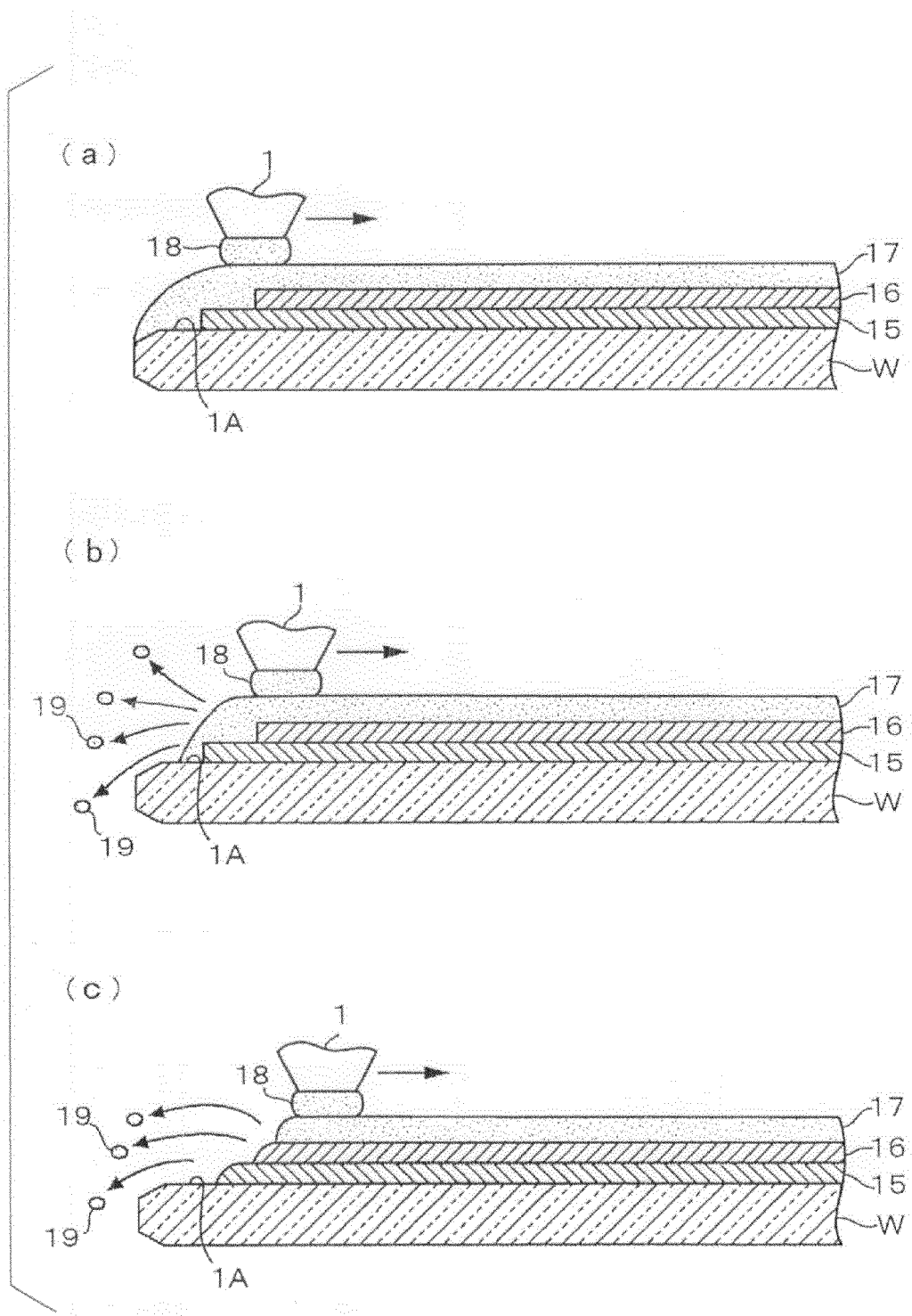
FIG. 16 is a diagram illustrating a peeling effect which may occur in the immersion exposure process.

The wafer W having been subjected to the heating process is transferred to the main conveyer A2, the cooling unit included in either the unit stack U1 or U2, the main conveyer A3, the transfer unit (TRS) in the unit stack U3, the first transfer arm 31A in the interface block B3, the transfer unit (TRS) in the unit stack U6, the second transfer arm 31B and the stage 40A in the exposure apparatus B4, in that order. Thereafter, as previously described in detail in the "BACKGROUND ART", the wafer W is placed on an exposure stage (not shown) in the exposure apparatus B4 where it is subjected to immersion exposure process using the immersion exposure head 1 (see FIG. 14) (step S6).

The wafer having been subjected to the immersion exposure is put on the transfer stage 40B in the exposure apparatus B4, and is conveyed into the interface block B3 by the second transfer arm 31B, and then is transferred to a cleaning device (RD), the transfer stage (TRS) in the unit stack U6, the first transfer arm 31A and the heating unit (PEB) in the unit stack U6, in that order. In the heating unit (PEB), heating process is performed (step S7), whereby an acid generated from an acid generating component contained in the resist of the exposed portion diffuses within the resist film. Under the effect of the acid, a chemical reaction occurs in the resist component, whereby a positive type resist becomes soluble in the developing solution, while a negative type resist becomes insoluble in the developing solution.

After the heating process, the wafer W is taken out of the heating unit (PEB) by the first transfer arm 31A, and is transferred to the temperature adjusting unit in the unit stack U6, the first transfer arm 31A, the transfer stage (TRS) in the unit stack U3, the main conveyer A3 and a protective film removing unit 29 in that order. In the protective film removing unit 29, a protective film removing solution is supplied to the wafer W, whereby the protective film 103 is removed from the wafer W (step S8). After the removal of the protective film 103, the wafer W is loaded into a developing unit 2A by the main conveyer A3. In the developing unit 2A, a developing solution is supplied to the front surface of the wafer W, and portions of the resist film 102, which is soluble in the developing solution, is dissolved, whereby a resist mask of a predetermined pattern is formed on the wafer front surface (step S9). Thereafter, the wafer W is transferred to the main conveyer A3, the heating unit included in either the unit stack U2 or U3, the main conveyer A3, the cooling unit included in either the unit stack U2 or U3, the main conveyer A2, the transfer unit (TRS) in the unit stack U1 and the conveyer 1, in that order, and is returned to the original carrier C1 on the carrier portion 20a by the conveyer A1.

The coating and developing apparatus of the foregoing embodiment is provided with: the antireflection film forming units 26 that forms an antireflection film on the front surface of the wafer W; the resist coating unit 27 that forms a resist film on the antireflection film, and the protective film forming unit 28 that forms a protective film for the resist film formed of a water-repellent material on the whole front surface of the wafer W. Further, the protective film forming unit 28 is provided with the adhesion-improving processor that supplies HMDS gas to an area including an exposed surface of silicon in the peripheral edge portion of the wafer W which has been exposed by removing the resist film and the antireflection film by supplying solvents from the edge rinse nozzles 71 of the units 26 and 27, thereby making the aforementioned area hydrophobic to improve the adhesion of the protective film to the exposed surface. Therefore, even when the wafer W is under pressure of a liquid film which is formed on the wafer W by the immersion exposure head 1 (see FIG. 14) when the wafer W is subjected to a immersion exposure process, peeling-off of the protective film from the exposed surface of the wafer W can be prevented. Thus, it is possible to avoid development of defects in a pattern, which otherwise may be caused by the fact that resist film contacts with pure water forming the liquid film and is subjected to physical force of the pure wafer to be peeled off from the substrate so that a normal developing process is obstructed. Moreover, it is possible to prevent the formation of particles derived from the peeled-off protective film and resist film, which would contaminate the interior of the exposure apparatus B4 to cause defects in an exposure process of the wafer W, or would adhere to the wafer W to cause defects in such processes as a heating process and a developing process after exposure process.

The adhesion-improving processor 8 is provided with the bracket-shaped nozzle body 81; the upper side portion 81a and the lower side portion 81b of the nozzle body 81 are disposed so as to sandwich the peripheral edge portion of the wafer W; and suctioning is performed by the suction port 86 formed in the lateral side portion 81c of the nozzle body 81, while supplying HMDS gas from the gas supply ports 82a and 82b formed in the upper and lower side portions 81a, 81b to the area including the exposed surface of the wafer W. Therefore, it is possible to prevent HMDS gas from adhering to the surface of the resist film and to prevent HMDS from being deposited thereon. Consequently, it is possible to prevent any defects in the exposure process due to deposited HMDS. In addition, the consumption of HMDS gas is suppressed in comparison with the case where HMDS gas is supplied to the whole surface of the wafer W, thus reducing the cost.

The stage 53, which is used for spreading the protective film forming material 105 in the protective film forming unit 28 to the whole surface of the wafer W by spin coating, is used also as a rotary stage for the supply of HMDS gas to the peripheral edge portion of the wafer W. Therefore the number of the stage in the unit 28 may be only one. Consequently, an increase in size of the unit 28 and that of the coating and developing apparatus are avoided.

In the foregoing embodiment, the hydrophobizing process is performed by supplying HMDS gas to the area including the exposed surface of the wafer W in order to enhance the adhesion between the wafer W and the protective film 103. Alternatively, in the hydrophobizing process, a gas of methylsilane series compound such as isopropenoxytrimethylsilane may be supplied. The hydrophobizing process may be carried out by applying a liquid containing a methylsilane series compound and under the situation where a puddle of the liquid is formed on the exposed surface.

The effect according to the present invention can be achieved if the foregoing HMDS gas is supplied to the exposed surface of silicon in the peripheral edge portion of the wafer W during the period after removal of the peripheral edge portion of the resist film and before formation of the protective film for the resist film. Thus, in a series of process steps for the wafer W performed by the foregoing coating and developing apparatus, the antireflection film need not be formed on the wafer W, and a film of another material may be formed between the antireflection film and the resist film.

Figure 11:
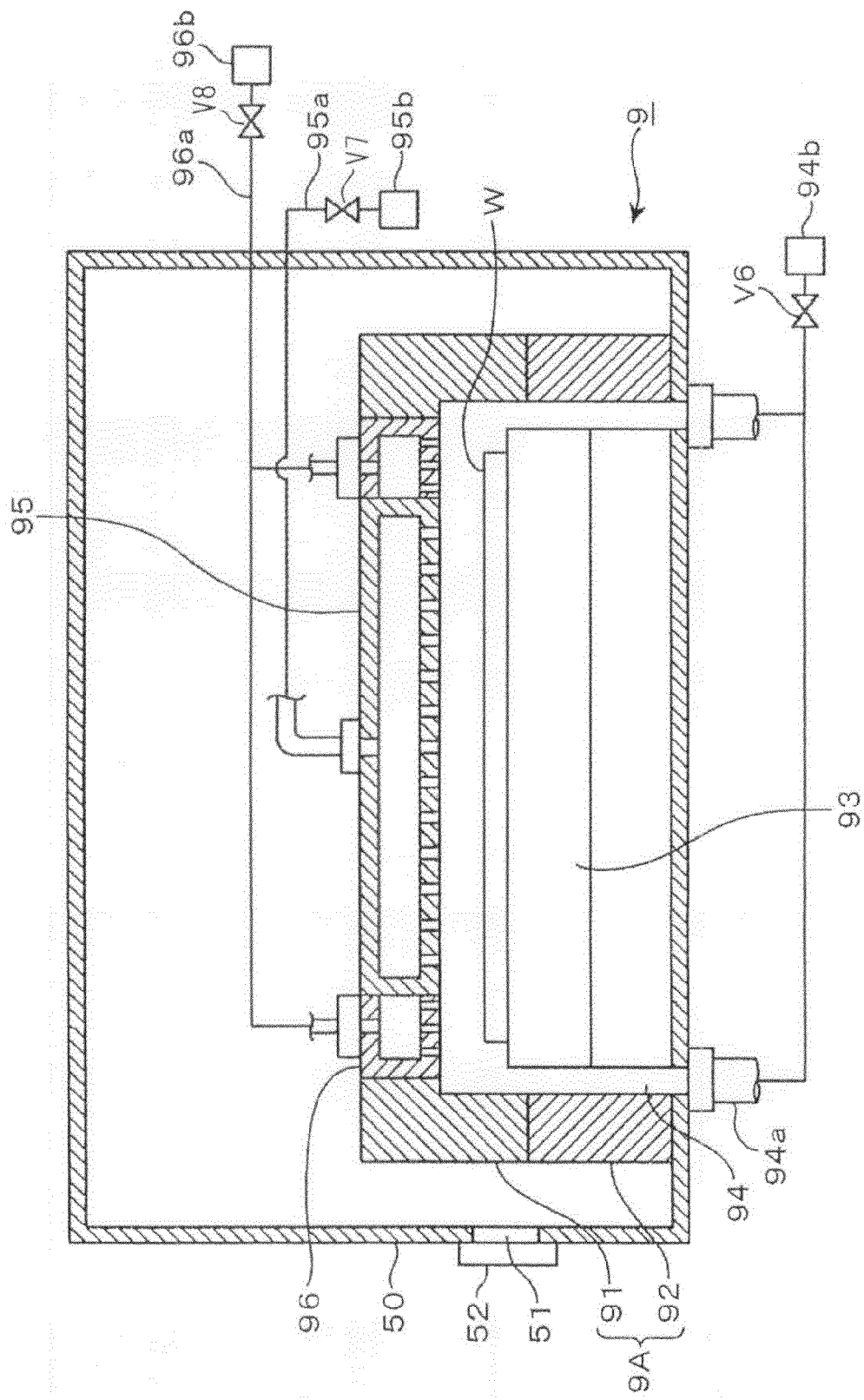
FIG. 11 is a schematic vertical cross-sectional view showing the configuration of an adhesion-improving processor, i.e., an adhesion-improving process unit, configured as an independent unit.

The adhesion-improving processor 8 which performs the hydrophobizing process as in the foregoing embodiment is not limited to the one installed within the protective film forming unit 28, but may be constituted as one independent liquid-processing unit which constitutes the liquid-processing unit stack U4 or U5. FIG. 11 shows an example of such an adhesion improving unit. Like the coating units 27 described above, this adhesion improving unit 9 is provided with a housing 50, a transfer port 51 and a shutter 52. A sealed vessel 9A composed of a lid 91 and a vessel body 92 is disposed in the interior of the housing 50. A table 93 for the wafer W, or a non-rotary stage, is disposed in the vessel body 92. Vertically-movable support pins (not shown) are provided in the table 93. A wafer W is transferred between the foregoing main conveyers A2, A3 and the table 93 via the support pins.

An exhaust path 94 is formed in the sealed vessel 9A so as to surround the table 93. One end of an exhaust pipe 94a which is for exhausting the interior of the sealed vessel 9A through the exhaust path 94 is connected to the exhaust path 94, while the other end of the exhaust pipe 94a is connected to suction means 94 through a valve V6.

An $N_2$ gas feeder 95, or a second gas feeder, is disposed in the central portion of the lid 91 so as to face the central portion of the wafer W placed on the table 93. An HMDS gas feeder 96, or a first gas feeder, is disposed in the peripheral edge portion of the lid 91 so as to face the peripheral edge portion of the wafer W and surround the $N_2$ gas feeder 95. The $N_2$ gas feeder 95 is connected through a gas supply pipe 95a to a gas supply source 95b storing $N_2$ gas. As will be described later, the $N_2$ gas is a purge gas which is supplied for removing surplus HMDS gas from the space near the peripheral edge portion of the wafer W in order to prevent the adhesion of the surplus HMDS gas to the resist film. Gas flow generated by the supply of the $N_2$ gas prevents the HMDS gas entering into the central portion of the wafer W. The HMDS gas feeder 96 is connected through a gas supply pipe 96a to a gas supply source 96b storing HMDS gas. Symbols V7 and V8 denote valves disposed in the gas supply pipes 95a and 96a, respectively.

Figure 12:
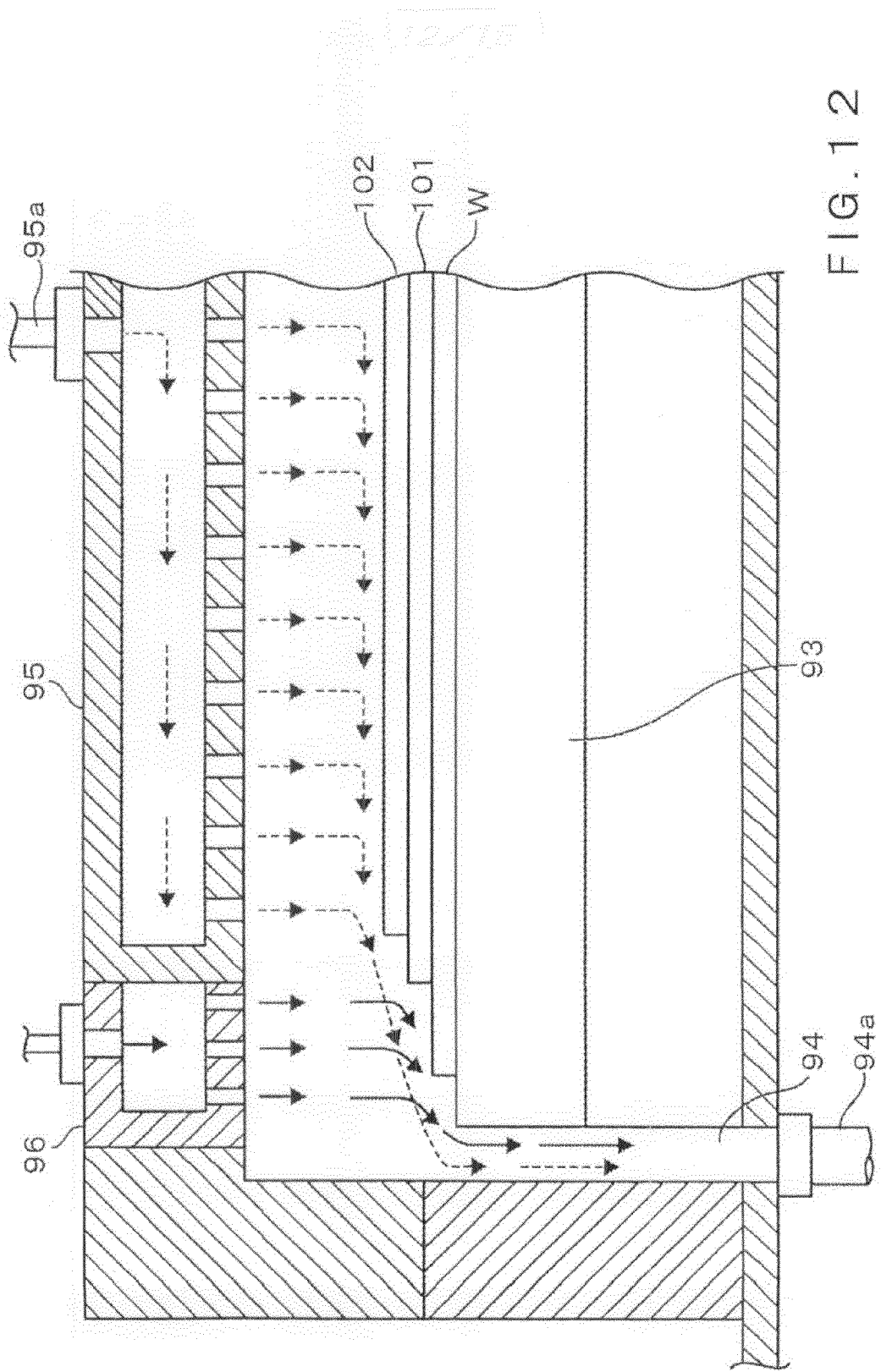
FIG. 12 is an explanatory diagram showing an air flow during process performed in the adhesion-improving process unit shown in FIG. 11.

In the adhesion improving unit 9, the lid 91 rises and the wafer W is put on the table 93 via the foregoing support pins. After the wafer W is put on the table 93, the lid 91 closes and HMDS gas is supplied from the HMDS gas feeder 96 to the peripheral edge portion of the wafer W, while $N_2$ gas is supplied from the $N_2$ gas feeder 95 to the central portion of the wafer W. In this case, the interior of the sealed vessel 9A is exhausted through the exhaust pipe 94a. FIG. 12 shows gas flow in the sealed vessel 9A in this case, in which solid lines represent the flow of HMDS gas and chain lines represent the flow of $N_2$ gas. As shown in FIG. 12, HMDS gas is supplied to the exposed surface of the wafer W from which both the resist film and the antireflection film have been removed so as to render the exposed surface hydrophobic, and the HMDS gas is then sucked to the outside of the wafer W by the exhaust pipe 94a. The $N_2$ gas, after being supplied to the central portion of the wafer W, goes toward the peripheral edge portion of the wafer W along the wafer surface, flows outwardly while entraining the surplus HMDS gas present in the space near the peripheral edge portion of the wafer, and flows into the exhaust pipe 94a through the exhaust path 94 together with HMDS gas to be discharged from the interior of the sealed vessel 9A.

In a case where the adhesion improving unit 9 is installed in a coating and developing apparatus, the foregoing effect can also be obtained. However, in a case where the adhesion-improving processor 8 is installed in the protective film forming unit 28, increment in the number of processing units in the coating and developing apparatus is suppressed, and complex motions of the main conveyers A2 and A3 for transferring a wafer W between the processing units can be avoided and thus a complicated transfer program can be avoided.

A description will now be given about a test conducted to confirm the effect of the present invention. Plural wafers W of silicon were prepared. No thin film was formed on the surfaces of the prepared wafers W. HMDS gas was supplied to the surface of the peripheral edge portion including a beveled portion of one wafer W to perform a hydrophobizing process, while the hydrophobizing process using HMDS gas was not performed for the other wafer W.

Figure 13:
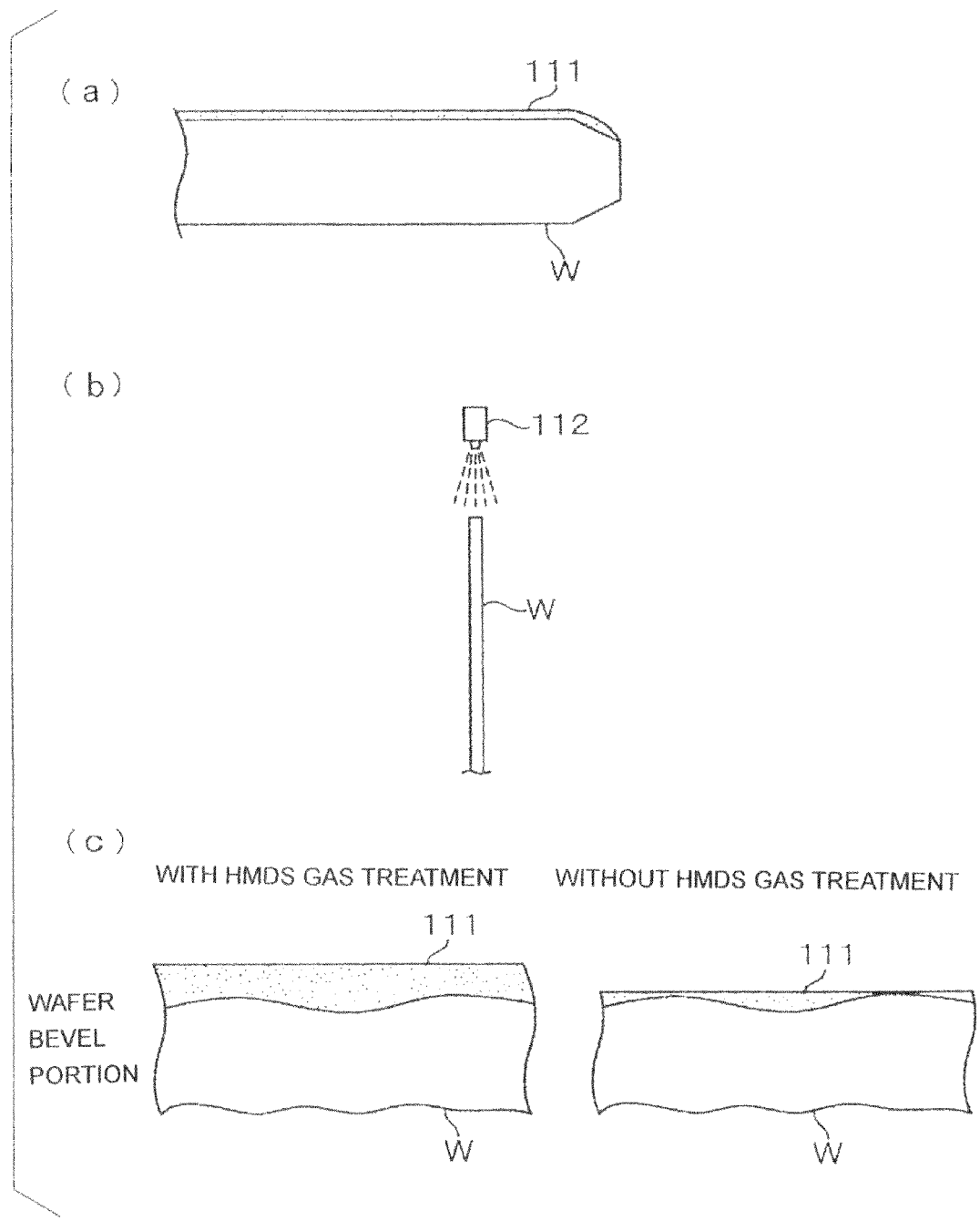
FIG. 13 shows diagrams illustrating a test for confirming the effect of the present invention and the results thereof.

A processing solution for a protective film for a resist film was applied to the whole surface of the wafer W subjected to the hydrophobizing process and the whole surface of the wafer W not subjected to the hydrophobizing process, using a coating unit as described in the foregoing embodiment, to form an organic film 111 on the whole surface of each wafer W. Then, as shown in FIG. 13(b), the wafers W having the organic film 111 formed thereon were held in a vertical attitude; and a nozzle 112 was disposed above each wafer W and pure water was vertically and downwardly discharged from the nozzle 112 toward the wafer W. The discharge flow rate and the discharge time of pure water were set to 4.1 L/min and 60 sec, respectively. At this time, the flow velocity of pure water was about 500 mm/sec.

Thereafter, the state of the beveled portion, supplied with the pure water, of each wafer W was observed. As shown in FIG. 13(c), in the wafer W whose peripheral edge portion was supplied with HMDS gas before formation of the organic film 111, peeling-off of the organic film 111 was not observed. However, in the wafer W to which HMDS gas was not supplied, peeling-off of the organic film 111 was observed. Thus, it was proved that the adhesion between the silicon surface of wafer and the organic film formed thereon could be enhanced by supplying HMDS gas to the peripheral edge portion of the wafer to render the peripheral edge portion hydrophobic.

The invention claimed is:

1. A coating and developing apparatus having a resist film forming unit that applies a resist solution to a front surface of a substrate to form a resist film, and a developing unit that develops the resist film having been subjected to immersion exposure, the coating and developing apparatus comprising:
   a first peripheral edge cleaner that supplies a solvent to the resist film present in a peripheral edge portion of the substrate thereby to remove the same;
   a protective film forming unit that supplies a coating solution onto the resist film thereby to form a water-repellent protective film that protects the resist film from a liquid when performing the immersion exposure;
   an adhesion-improving processor having an adhesion-improving fluid feeder that supplies, before forming the protective film, an adhesion-improving fluid only to the peripheral edge portion of the substrate, the peripheral edge portion having an exposed surface exposed due to removal of the resist film from the peripheral edge portion, wherein the adhesion improving fluid improves adhesion of the protective film to the exposed surface, wherein:

the adhesion-improving processor further has a rotary stage configured to rotate about a vertical axis while holding the substrate horizontally; and the adhesion-improving fluid feeder has:
- a first adhesion-improving fluid supply nozzle adapted to locate above the peripheral edge portion of the front surface of the substrate held on the rotary stage;
- a second adhesion-improving fluid supply nozzle adapted to locate below a peripheral edge portion of a back surface of the substrate held on the rotary stage; and
- a suction nozzle that is positioned radially outside the substrate to suction and remove the adhesion improving fluid having been supplied to the peripheral edge portion of the substrate;

the protective film forming unit has a rotary stage capable of rotating about a vertical axis while holding the substrate, and a nozzle that supplies a coating solution for forming a protective film to the substrate held on the rotary stage, and the adhesion improving processor is installed within the protective film forming unit, and the rotary stage in the protective film forming unit is used as the rotary stage in the adhesion-improving processor.

2. The coating and developing apparatus according to claim 1, wherein:

the adhesion-improving fluid feeder is configured to feed the adhesion-improving fluid also to a peripheral edge portion of a back surface of the substrate.

3. The coating and developing apparatus according to claim 1, further comprising:
- an antireflection film forming unit that supplies a coating solution to the substrate before forming the resist film thereby to form an antireflection film on the front surface of the substrate; and
- a second peripheral edge cleaner that supplies a solvent to the antireflection film in the peripheral edge portion of the substrate before forming the resist film thereby to remove the antireflection film from the peripheral edge portion of the substrate.

4. The coating and developing apparatus according to claim 1, wherein:

the adhesion-improving fluid feeder has a bracket-shaped or U-shaped nozzle body, which is arranged so as to allow the peripheral edge portion of the substrate held on the rotary stage to be inserted in the nozzle body; and the first and second adhesion-improving fluid supply nozzles and the suction nozzle are provided at the nozzle body.

5. The coating and developing apparatus according to claim 1, wherein the adhesion-improving fluid is hexamethyldisilazane.

* * * * *

UNITED STATES PATENT AND TRADEMARK OFFICE
CERTIFICATE OF CORRECTION

PATENT NO.         : 9,214,363 B2                                       Page 1 of 1
APPLICATION NO.    : 13/937833
DATED              : December 15, 2015
INVENTOR(S)        : Taro Yamamoto et al.

It is certified that error appears in the above-identified patent and that said Letters Patent is hereby corrected as shown below:

On the title page, Item (12), the Letters Patent Heading, and Item (72), the order of the Inventors is incorrect. Items (12) and (72) should read:

--(12)   United States Patent
         Taro Yamamoto et al.

(72)   Inventors:   Taro Yamamoto, Koshi (JP);
                      Hideharu Kyouda, Koshi (JP)--

Signed and Sealed this
Fifteenth Day of March, 2016

Michelle K. Lee
*Director of the United States Patent and Trademark Office*